(12) United States Patent
Kanzaki et al.

(10) Patent No.: US 8,653,531 B2
(45) Date of Patent: Feb. 18, 2014

(54) THIN FILM TRANSISTOR AND DISPLAY DEVICE

(75) Inventors: Yohsuke Kanzaki, Osaka (JP); Yudai Takanishi, Osaka (JP); Yoshiki Nakatani, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 58 days.

(21) Appl. No.: 13/509,367

(22) PCT Filed: Jul. 8, 2010

(86) PCT No.: PCT/JP2010/061632
§ 371 (c)(1),
(2), (4) Date: May 17, 2012

(87) PCT Pub. No.: WO2011/058790
PCT Pub. Date: May 19, 2011

(65) Prior Publication Data
US 2012/0223316 A1 Sep. 6, 2012

(30) Foreign Application Priority Data
Nov. 12, 2009 (JP) ................................. 2009-258865

(51) Int. Cl.
*H01L 29/786* (2006.01)

(52) U.S. Cl.
USPC ............ 257/72; 257/59; 257/66; 257/E27.06; 257/E29.273

(58) Field of Classification Search
CPC ................... H01L 29/66765; H01L 29/78618; H01L 29/78678; H01L 29/78696; H01L 27/1225

USPC .................. 257/59, 66, 72, E27.06, E29.273
See application file for complete search history.

(56) References Cited

U.S. PATENT DOCUMENTS

| 5,021,850 A | 6/1991 | Tanaka et al. |
| 2005/0263770 A1 | 12/2005 | Sugahara et al. |
| 2010/0123654 A1* | 5/2010 | Kimura ........................... 345/92 |

FOREIGN PATENT DOCUMENTS

| JP | S62-30375 A | 2/1987 |
| JP | 6-87466 B2 | 11/1994 |
| JP | H08-8440 A | 1/1996 |
| JP | 2005-340638 A | 12/2005 |
| JP | 2007-140547 A | 6/2007 |

* cited by examiner

*Primary Examiner* — Matthew W Such
*Assistant Examiner* — David Spalla
(74) *Attorney, Agent, or Firm* — Chen Yoshimura LLP

(57) ABSTRACT

Disclosed is a thin film transistor wherein an ON current is increased and a leak current is reduced. The channel layer 60 of the TFT 10 is formed of a crystalline silicon, and the lower surface of one end of the channel layer 60 is electrically connected to the surface of an $n^+$ silicon layer 40a, and the lower surface of the other end is electrically connected to the surface of an $n^+$ silicon layer 40b. Furthermore, the side surface of said end of the channel layer 60 is electrically connected to a source electrode 50a, and the side surface of the other end is electrically connected to a drain electrode 50b. Thus, a barrier that makes electrons, which act as carriers, not easily transferred is formed on the boundary between the source electrode 50a and the channel layer 60. As a result, the ON current that flows when the TFT 10 is in the ON state can be increased, and the leak current that flows when the TFT is in the OFF state can be reduced.

7 Claims, 16 Drawing Sheets

Gate electrode | Gate insulation film | Channel Layer | Protective film

Source electrode | Channel Layer | Drain electrode

Ohmic contact

THIN FILM TRANSISTOR AND DISPLAY DEVICE

TECHNICAL FIELD

The present invention relates to a thin film transistor and a display device. More particularly, the present invention relates to a thin film transistor equipped with a channel layer formed of a crystalline semiconductor and to a display device provided with such a thin film transistor.

BACKGROUND ART

FIG. 32 is a cross-sectional drawing showing the structure of a conventional thin film transistor 900 (referred to hereinafter as a TFT). The TFT 900 is an n-channel type TFT. As shown in FIG. 32, a gate electrode 920 is formed on an insulating substrate 911, which is a glass substrate or the like, for example. A gate insulation film 930 is formed so as to cover the insulating substrate 911 including the gate electrode 920. A channel layer 960 formed of microcrystalline silicon is formed on the upper face of the gate insulation film 930 so as to overlap the gate electrode 920 as viewed from above. At respective lateral end parts of the channel layer 960, silicon layers 940a and 940b made of silicon doped with a high concentration of n-type impurity (referred to hereinafter as the "n$^+$ silicon layer") are formed. The n$^+$ silicon layer 940a functions as the source region, and the n$^+$ silicon layer 940b functions as the drain region. A source electrode 950a electrically connected to the upper face of the n$^+$ silicon layer 940a extends in the leftward direction, and a drain electrode 950b electrically connected to the upper face of the n$^+$ silicon layer 940b extends in the rightward direction. Furthermore, a protective film 970 is formed so as to cover the insulating substrate 911 including the source electrode 950a, the drain electrode 950b, and the channel layer 960.

Since the microcrystalline silicon is crystalline silicon, its electrical conductivity is higher than that of amorphous silicon. Therefore, for the TFT 900 equipped with a channel layer 960 formed of microcrystalline silicon, the ON current becomes high in comparison to a TFT having the same structure as the channel layer 960 formed of amorphous silicon.

Japanese Patent Application Laid-Open Publication No. S62-30375 discloses a back gate type TFT equipped with a gate electrode arranged upon an insulating substrate, a channel layer arranged above the gate electrode, and within the same plane as the channel layer, a source electrode and drain electrode arranged so as to sandwich the channel layer. Since the channel layer is directly connected to the source electrode, and since the channel layer is directly connected to the drain electrode, resistance between the source electrode and the drain electrode becomes small, and the operating speed of the TFT of this structure improves.

Japanese Patent Application Laid-Open Publication No. H8-8440 discloses a back gate type TFT provided with a channel layer composed of intrinsic amorphous silicon. A p-type layer doped by a p-type impurity is formed, among the surfaces of the channel layer of this TFT, at the surface opposite to the gate electrode (referred to hereinafter as the "back channel side"). The p-type layer prevents positive ions from the exterior from attaching to the back channel side surface of the channel layer and prevents electrical charging of the protective film, and therefore, thereby reducing leak current flowing to the back channel side of the channel layer.

RELATED ART DOCUMENTS

Patent Documents

Patent Document 1: Japanese Patent Application Laid-Open Publication No. 562-30375
Patent Document 2: Japanese Patent Application Laid-Open Publication No. H8-8440

SUMMARY OF THE INVENTION

Problems to be Solved by the Invention

In order to switch the TFT 900 shown in FIG. 32 to the OFF state, a negative voltage is applied to the gate electrode 920. Then, electrons, which act as carriers in the channel layer 960, are driven away from the vicinity of the surface on the side of the gate electrode 920 and gather in the vicinity of the back channel side surface. When a voltage is applied between the drain electrode 950b and the source electrode 950a, as indicated by the dotted line, the leak current flows to the source electrode 950a from the drain electrode 950b and through the n$^+$ silicon layer 940b, the vicinity of the back channel side surface of the channel layer 960, and through the n$^+$ silicon layer 940a. Since the electrical conductivity of crystalline silicon is higher than that of amorphous silicon, for the TFT 900 that has a channel layer 960 composed of crystalline silicon (microcrystalline silicon or the like), both the ON current and leak current become high in comparison to a TFT that has a channel layer 960 composed of amorphous silicon.

Moreover, when a negative voltage is applied to the gate electrode of the TFT described in Japanese Patent Application Laid-Open Publication No. S62-30375, electrons accumulate in the vicinity of the back channel side surface of the channel layer. Also, as mentioned above, resistance between the source electrode and drain electrode through the channel layer at the back channel side is low. Thus, a large leak current readily flows to the source electrode from the drain electrode through the vicinity of the back channel side surface of the channel layer.

The channel layer mentioned in Japanese Patent Application Laid-Open Publication No. H8-8440 is composed of an amorphous silicon layer and a p-type layer formed at the surface thereof. Thus, when a negative voltage is applied to the gate electrode, electrons driven away from the vicinity of the gate electrode side surface of the channel layer gather in the low-resistance p-type layer. In this case, the leak current becomes large because the leak current readily flows from the drain electrode to the source electrode through the p-type layer.

Thus an object of the present invention is to provide a thin film transistor capable of increasing the ON current while decreasing the leak current.

Means for Solving the Problems

A first aspect of the present invention is a thin film transistor that is a back gate type thin film transistor formed on an insulating substrate;
where the thin film transistor includes:
a gate electrode formed on the aforementioned insulating substrate;
a gate insulation film formed so as to cover the aforementioned gate electrode;
a source region and a drain region made of a semiconductor including an impurity, the source region and the drain region being disposed with a prescribed distance therebetween on the aforementioned gate insulation film;
a source electrode and a drain electrode made of a metal, disposed on the aforementioned source region and the aforementioned drain region, respectively; and
a channel layer formed on a gate insulation film sandwiched between the aforementioned source electrode and the aforementioned drain electrode and electrically connected to the aforementioned source region and the aforementioned drain region,
wherein the aforementioned channel layer is made of an intrinsic semiconductor having crystallinity,
wherein one end of the aforementioned channel layer on the aforementioned gate electrode side is connected electrically to the aforementioned source region and the other end on the aforementioned gate electrode side is electrically connected to the aforementioned drain region,
wherein one end of the aforementioned channel layer on a back channel side is connected electrically to the aforementioned source region and the other end is electrically connected to the aforementioned drain electrode, and
wherein a barrier for restricting movement of carriers is formed at a boundary between the aforementioned source electrode and the aforementioned channel layer or at a boundary between the aforementioned drain electrode and the aforementioned channel layer on the channel layer back channel side.

A second aspect of the present invention is the first aspect of the present invention, wherein ohmic contacts are formed between the aforementioned source electrode and the aforementioned source region and between the aforementioned drain electrode and the aforementioned drain region, and
wherein the barrier restricting movement of the aforementioned carriers is an ohmic contact having an energy level difference greater than that of the aforementioned ohmic contacts.

A third aspect of the present invention is the first aspect of the present invention, wherein a concentration of the aforementioned impurity included in the aforementioned source region and the aforementioned drain region is such that a tunneling effect occurs between the aforementioned source electrode and the aforementioned source region and between the aforementioned drain electrode and the aforementioned drain region, and
wherein the barrier restricting movement of the aforementioned carriers is Schottky barriers respectively formed at the boundary between the aforementioned source electrode and the aforementioned source region and at the boundary between the aforementioned drain electrode and the aforementioned drain region.

The fourth aspect of the present invention is the first aspect of the present invention,
wherein the aforementioned thin film transistor is an n-channel type transistor;
and the barrier restricting movement of the aforementioned carriers is formed at the interface between the aforementioned source electrode and the aforementioned channel layer.

The fifth aspect of the present invention is the first aspect of the present invention,
where the aforementioned thin film transistor is a p-channel type transistor, and
wherein the barrier restricting movement of the aforementioned carriers is formed at the interface between the aforementioned drain electrode and the aforementioned channel layer.

The sixth aspect of the present invention is the first aspect of the present invention, wherein the aforementioned source region and the aforementioned drain region include protrusion parts respectively protruding from ends of the aforementioned source electrode and the aforementioned drain electrode on the gate insulation film sandwiched between the aforementioned source electrode and the aforementioned drain electrode, and
wherein the aforementioned channel layer is further electrically connected to an upper face of the aforementioned protrusion parts.

The seventh aspect of the present invention is an active matrix type display device for display of an image;
wherein the aforementioned display device includes:
a display part including a plurality of gate lines, a plurality of source lines intersecting the aforementioned plurality of gate lines, and a pixel formation part arrayed in a matrix pattern corresponding to respective intersection points of the aforementioned plurality of gate lines and plurality of source lines;
a gate driver for selective activation of the aforementioned plurality of gate lines; and
a source driver for applying to the aforementioned source line an image signal representing an image to be displayed,
wherein the aforementioned pixel formation part includes a switching element for ON-OFF switching according to a signal applied to a corresponding gate line, and
wherein the aforementioned switching element is the thin film transistor according to the first aspect.

In an eighth aspect of the present invention, the aforementioned gate driver and the aforementioned source driver are composed of thin film transistors according to the first aspect.

Effects of the Invention

According to the first aspect of the present invention, the channel layer of the thin film transistor is formed of a crystalline semiconductor, one end of the channel layer on the gate electrode side is connected electrically to the source region, and the other end is connected electrically to the drain region. Thus, when the thin film transistor is in the ON state, a high ON current can flow through the vicinity of the surface of the channel layer on the gate electrode side. Moreover, since one end of the channel layer on the back channel side is connected electrically to the source electrode, and since the other end is electrically connected to the drain electrode, barriers that prevent the movement of carriers are formed at the boundary between the source electrode and the channel layer and at the boundary between the drain electrode and the channel layer. This way, when the thin film transistor is in the OFF state, the leak current flowing through the vicinity of the back channel side surface can be made small.

According to the second aspect of the present invention, respective ohmic contacts are made between the source electrode and the source region and between the drain electrode and the drain region. Thus, when the thin film transistor is in the ON state, ON current flows according to the applied voltage. However, the barrier that restricts the movement of carriers and that is formed between the source electrode and channel layer or between the drain electrode and channel layer at the channel layer back channel side has a greater energy level difference than the ohmic contacts between the source electrode and source region and between the drain electrode and drain region. Therefore, when the thin film transistor is in the OFF state, the leak current flowing through the vicinity of the back channel side surface can be made small.

According to the third aspect of the present invention, respective Schottky barriers are formed at the boundary between the source electrode and the source region and at the boundary between the drain electrode and the drain region. However, the concentration of the impurity included in the source region and drain region is a concentration such that carriers can tunnel through these Schottky barriers by the tunneling effect. Thus, when the thin film transistor is in the ON state, the ON current flows due to the tunneling effect. On the other hand, the barrier for restricting the movement of carriers and formed at the boundary between the source electrode and the channel layer or at the boundary between the drain electrode and the channel layer at the channel layer back channel side is also a Schottky barrier. However, since the channel layer contacting the source electrode and the drain electrode does not contain such a high concentration of impurity as would cause a tunneling effect to occur, current does not flow by the tunneling effect at the back channel side. Thus, when the thin film transistor is in the OFF state, the leak current flowing through the vicinity of the back channel side surface can be made small.

According to the fourth aspect of the present invention, in an n-channel type thin film transistor, a barrier for suppression of carrier movement is formed at the boundary between the source electrode and the channel layer. Thus, when the thin film transistor is in the OFF state, it becomes difficult for electrons (i.e., the carriers) to move from the source electrode to the channel layer. Therefore, when the thin film transistor is in the OFF state, the leak current flowing through the vicinity of the back channel side surface can be made small.

According to the fifth aspect of the present invention, a barrier for restricting the movement of carriers is formed at the boundary between the drain electrode and the channel layer in a p-channel type thin layer transistor. Thus, when the thin film transistor is in the OFF state, it becomes difficult for holes (i.e., the carriers) to move from the drain electrode to the channel layer. Therefore, when the thin film transistor is in the OFF state, the leak current flowing through the vicinity of the back channel side surface can be made small.

According to the sixth aspect of the present invention, the channel layer is not only connected electrically to the ends of the source region and the drain region, but also is connected electrically to the upper faces of protrusion parts protruding respectively from the source region and the drain region. Thus, the respective contact resistance values between the source region and the channel layer and between the drain region and the channel layer can be reduced.

According to the seventh aspect of the present invention, when the thin film transistor according to the first aspect is used as a switching element of a pixel formation part, since the ON current of the thin film transistor is high, it is possible to operate the thin film transistor in short time interval. Thus, the number of pixel formation parts can be increased, and it becomes possible to obtain high resolution and suppress flickers. Moreover, due to the reduced leak current of the thin film transistor, it is possible to retain the signal voltage of the image signal by the pixel formation part until the next image signal. Thus, lowering of contrast of the displayed image is prevented, and it is possible for the display device to display a high quality image.

According to the eighth aspect of the present invention, the ON current of the thin film transistor of the first aspect can be increased, and it is thus possible to increase the operating speed of the drive circuit formed using such a thin film transistor. By reducing the size of the drive circuit this way, it is possible to reduce the size of the frame of the display device equipped with such a drive circuit, and it is possible to reduce electrical power consumption of the display device.

DETAILED DESCRIPTION OF EMBODIMENTS

1. Embodiment 1

1.1 TFT Structure

Figure 1:
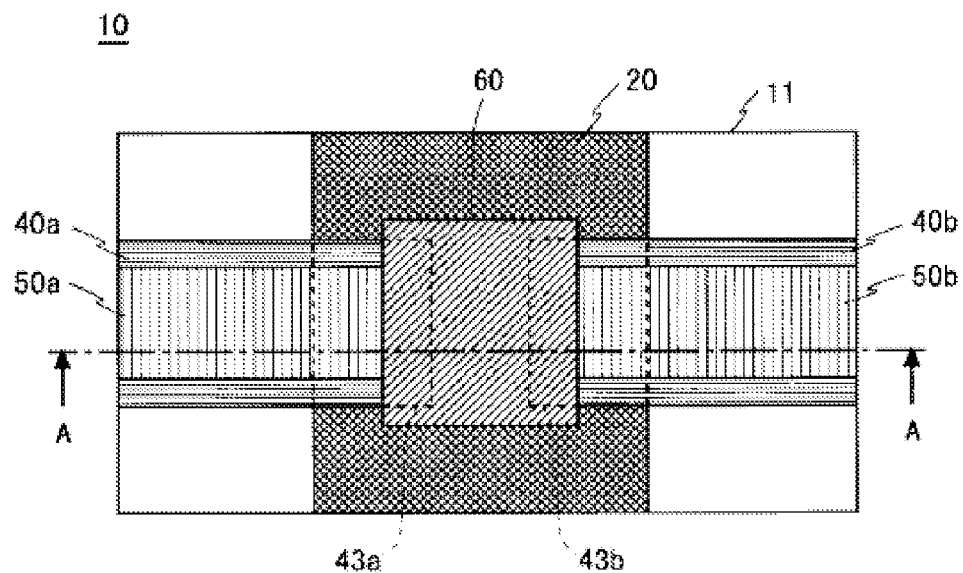
FIG. 1 is a plan view showing the structure of a TFT that is a thin film transistor according to a first embodiment of the present invention.
Figure 2:
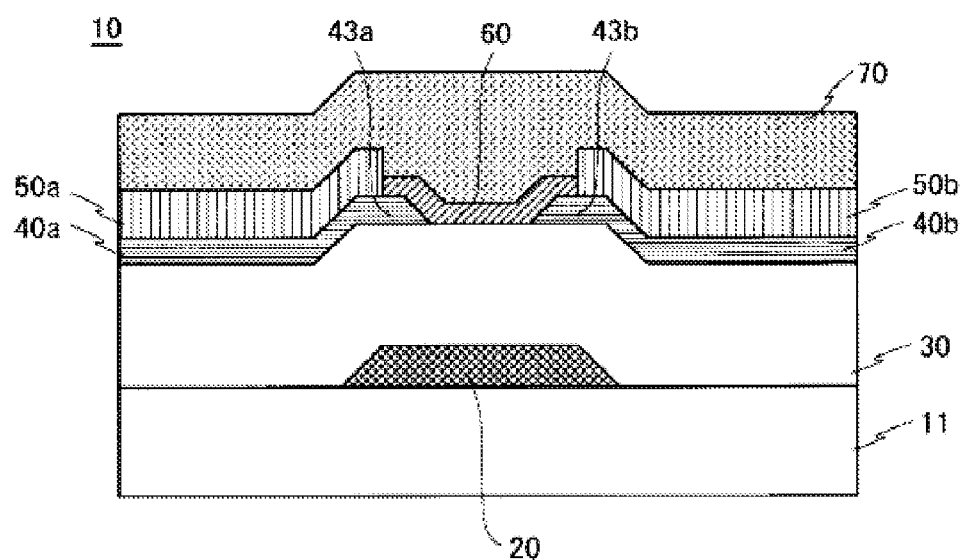
FIG. 2 is a cross-sectional drawing of the TFT at the A-A line shown in FIG. 1.

FIG. 1 is a plan view showing the structure of a TFT 10 according to a first embodiment of the present invention, and FIG. 2 is a cross-sectional drawing of the TFT 10 at the A-A line shown in FIG. 1. The structure of an n-channel type TFT 10 will be described by referring to FIGS. 1 and 2. As shown in FIGS. 1 and 2, a gate electrode 20 is formed on an insulating substrate 11, such as a glass substrate or the like. The gate electrode 20, for example, is formed as a stacked metal film by stacking a titanium (Ti) film, an aluminum (Al) film, and a titanium film in that order from the side of the insulating substrate 11. A gate insulation film 30 is formed so as to cover the insulating substrate 11 including the gate electrode 20.

On the upper face of the gate insulation film 30, an n$^+$ silicon layer 40a is formed extending in the leftward direction from the left end portion of the gate electrode 20, and an n$^+$ silicon layer 40b is formed extending in the rightward direction from the right end portion of the gate electrode 20, such that the lateral direction ends of the gate electrode 20 are partially overlapped in a plan view. The n$^+$ silicon layer 40a functions as the source region, and the n$^+$ silicon layer 40b functions as the drain region. Both of the n$^+$ silicon layers 40a and 40b are doped with a high concentration of an n-type impurity (concentration of 10$^{20}$/cm$^3$). On the upper face of the n$^+$ silicon layer 40a, a leftward extending source electrode 50a that is narrower than the n$^+$ silicon layer 40a is formed. On the upper face of the n$^+$ silicon layer 40b, a rightward extending drain electrode 50b that is narrower than the n$^+$ silicon layer 40b is formed. The source electrode 50a and drain electrode 50b are formed from a stacked metal film in the same manner as the gate electrode 20 by stacking a titanium film, an aluminum film, and a titanium film in that order.

Above the gate insulation film 30 sandwiched between the source electrode 50a and the drain electrode 50b, the n$^+$ silicon layer 40a and the n$^+$ silicon layer 40b protrude beyond the respective ends of the source electrodes 50a and 50b as the extending protrusion parts 43a and 43b, respectively. Above the gate insulation film 30 sandwiched between the source electrode 50a and the drain electrode 50b, a channel layer 60 made of microcrystalline silicon is formed. One end of the channel layer 60 is formed so as to overlap the upper face of the protrusion part 43a and is electrically connected to the n$^+$ silicon layer 40a. The other end of the channel layer 60 is formed so as to overlap the upper face of the protrusion part 43b and is electrically connected to the n$^+$ silicon layer 40b. Thus, in addition to the ends of the channel layer 60 being connected electrically to the respective ends of the n$^+$ silicon layers 40a and 40b, the bottom surface at both ends of the channel layer 60 is electrically connected to the respective upper surfaces of the protrusion parts 43a and 43b. It is thus possible to reduce contact resistance between the channel layer 60 and the n$^+$ silicon layers 40a and 40b. Furthermore, a protective film 70 is formed so as to cover the insulating substrate 11 that includes the channel layer 60, source electrode 50a, and drain electrode 50b. In order to improve appearance of the figure, the gate insulation film 30 and the protective film 70 are omitted from FIG. 1.

1.2 Principles of Operation of TFT

When a positive voltage is applied to the gate electrode 20 of the TFT 10, electrons, which act as carriers, accumulate in the vicinity of the electrode 20 side surface of the channel layer 60. Thus, if a positive voltage is applied to the drain electrode 50b and a negative voltage is applied to the source electrode 50a, the TFT 10 enters the ON state, and an ON current flows from the drain electrode 50b to the source electrode 50a.

On the other hand, if a negative voltage is applied to the gate electrode 20, electrons are repelled from the vicinity of the gate electrode 20 side surface of the channel layer 60, and the repelled electrons accumulate in the vicinity of the back channel side surface. In this case, since the electrons are accumulating in the vicinity of the back channel side surface, even if a positive voltage is applied to the drain electrode 50b and a negative voltage is applied to the source electrode 50a, the TFT 10 enters the OFF state, and the ON current does not flow.

Movement of electrons as the carriers will be described with reference to energy band diagrams in the cases of the TFT 10 being in the ON state and in the OFF state. The energy band diagrams differ depending whether the work function of the source electrode 50a and drain electrode 50b is greater than the electron affinities of the n$^+$ silicon layers 40a and 40b and of the channel layer 60 (also referred to as the "conduction band energy levels"), and therefore, various cases will be described in turn.

First, a case will be described in which the work function of the source electrode 50a and drain electrode 50b is smaller than the energy levels of the conduction band of the n$^+$ silicon layers 40a and 40b and the channel layer 60. As described above, the gate electrode 20 of the TFT 10 is made of stacked metal films by stacking a titanium film, an aluminum film, and a titanium film in that order. In this case, the work function of titanium is 4.14 eV, and the work function of aluminum is 4.13 eV, i.e., both are about 4.1 eV. Thus, in below descriptions, for simplicity, the work function of the gate electrode 20 is assumed to be 4.1 eV. Moreover, the work function of the n$^+$ silicon layers 40a and 40b is assumed to be 4.3 eV, and the work function of the intrinsic silicon composing the channel layer 60 is assumed to be 4.6 eV.

Figure 3:
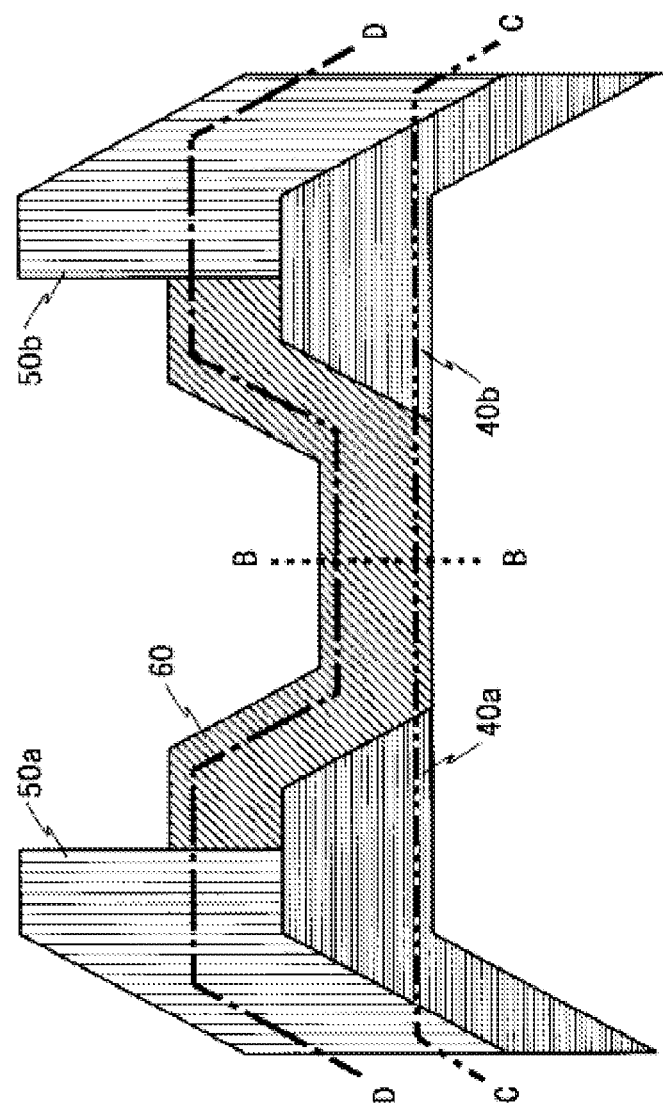
FIG. 3 is a magnified cross-sectional drawing of the periphery of the channel layer of the TFT shown in FIG. 2.
Figure 4:
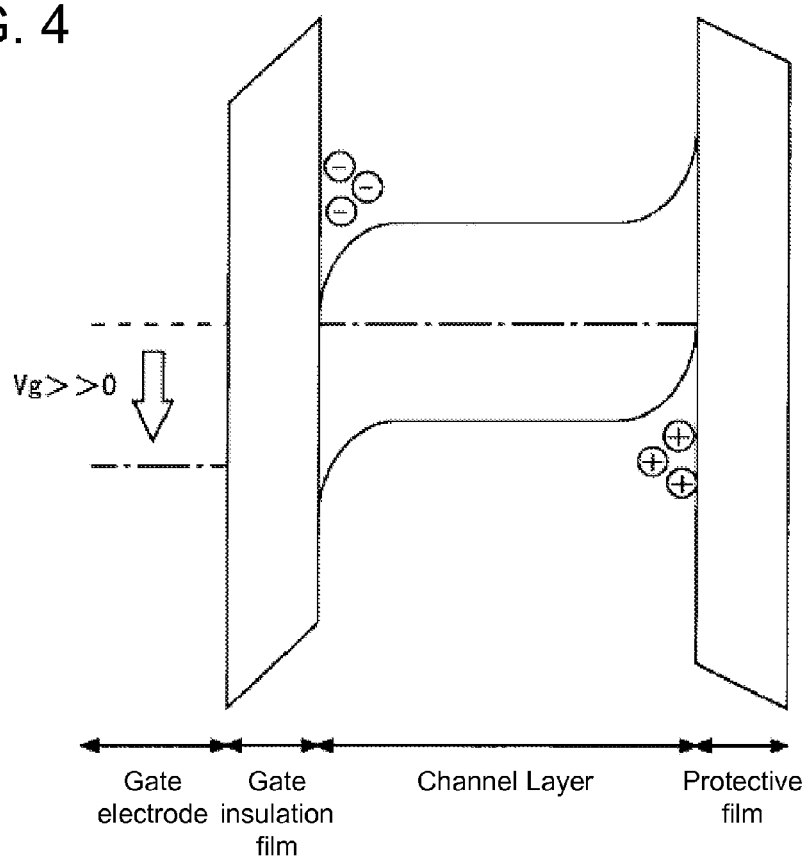
FIG. 4 is an energy band diagram along the B-B line shown in FIG. 3 when the TFT shown in FIG. 2 is in the ON state and when the work function of the source electrode/drain electrode is small.
Figure 5:
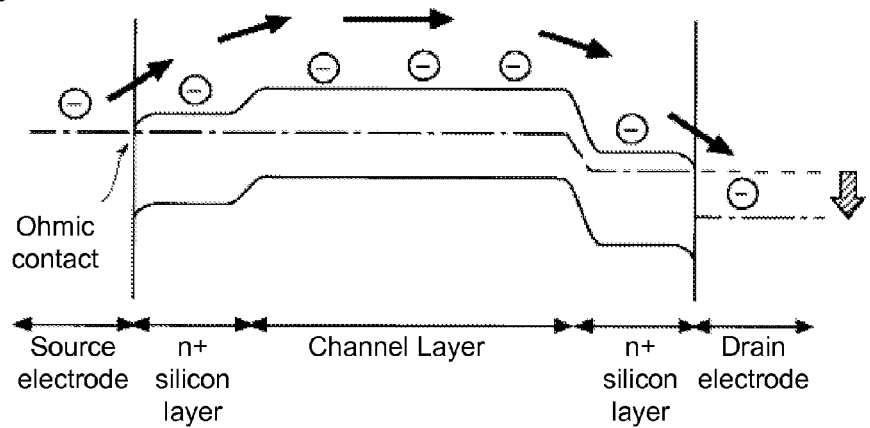
FIG. 5 is an energy band diagram along the C-C line shown in FIG. 3 when the TFT shown in FIG. 2 is in the ON state and when the work function of the source electrode/drain electrode is small.
Figure 6:
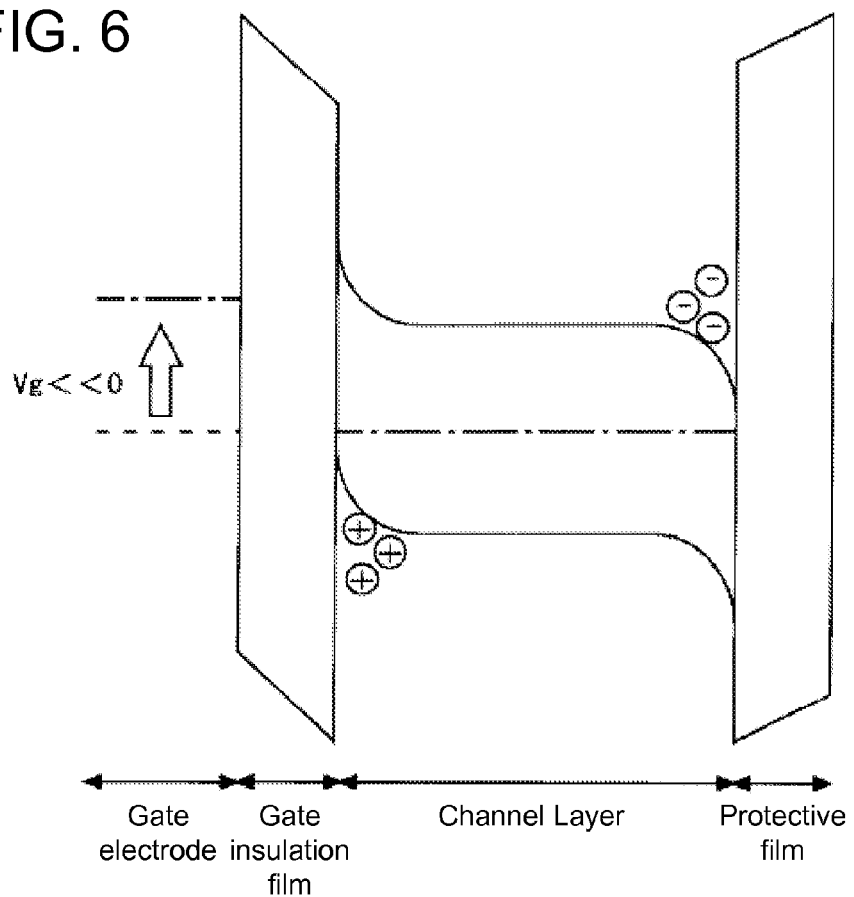
FIG. 6 is an energy band diagram along the B-B line shown in FIG. 3 when the TFT shown in FIG. 2 is in the OFF state and when the work function of the source electrode/drain electrode is small.
Figure 7:
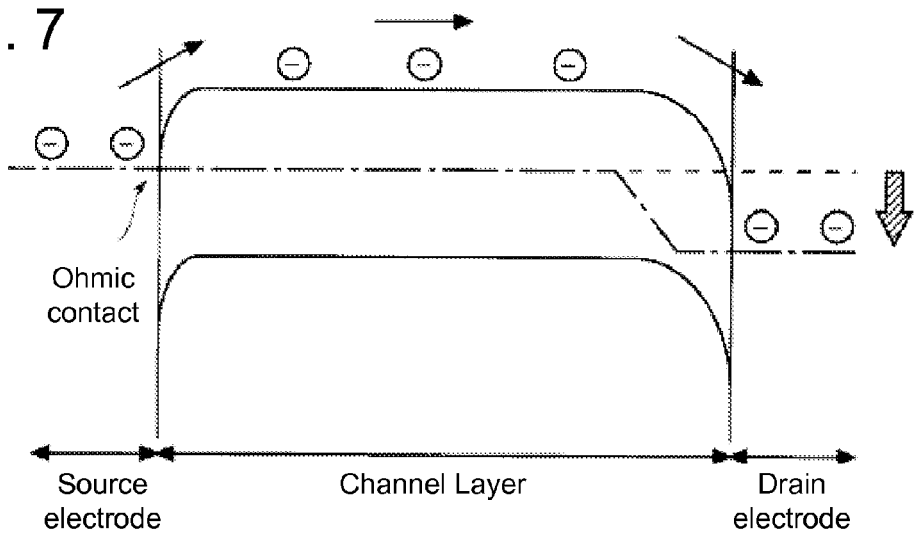
FIG. 7 is an energy band diagram along the D-D line shown in FIG. 3 when the TFT shown in FIG. 2 is in the OFF state and when the work function of the source electrode/drain electrode is small.

FIG. 3 is a magnified cross-sectional drawing of the periphery of the channel layer 60 of the TFT 10. FIG. 4 is an energy band diagram along the B-B line shown in FIG. 3 when the TFT 10 is in the ON state. FIG. 5 is an energy band diagram along the C-C line shown in FIG. 3 when the TFT 10 is in the ON state. FIG. 6 is an energy band diagram along the B-B line shown in FIG. 3 when the TFT 10 in the OFF state. FIG. 7 is an energy band diagram along the D-D line shown in FIG. 3 when the TFT 10 in the OFF state.

First, the TFT 10 in the ON state will be described with reference to FIGS. 4 and 5. When a positive voltage is applied to the gate electrode 20, as shown in FIG. 4, electrons accumulate in the vicinity of the gate electrode 20 side surface of the channel layer 60.

On the other hand, the conduction band and valence band energy levels are adjusted such that the Fermi levels of the source electrode 50a, the n$^+$ silicon layer 40a, the channel layer 60, the n$^+$ silicon layer 40b, and the drain electrode 50b coincide. Specifically, the energy level of the conduction band of the n$^+$ silicon layer 40a becomes just 0.2 eV higher than the Fermi level of the source electrode 50a, and the energy level of the conduction band of the channel layer 60 becomes just 0.3 eV higher than the energy level of the conduction band of the n$^+$ silicon layer 40a. As a result, a barrier of 0.2 eV height is formed at the boundary between the source electrode 50a and the n$^+$ silicon layer 40a, and a barrier of 0.3 eV height is formed at the boundary between the n$^+$ silicon layer 40a and the channel layer 60. Similarly, respective barriers are formed at the boundary between the drain electrode 50b and the n$^+$ silicon layer 40b and at the boundary between the n$^+$ silicon layer 40b and the channel layer 60. Since the heights of these barriers are all low, electrons acting as carriers are able to move in response to a voltage applied between the drain electrode 50b and the source electrode 50a. Therefore, the contacts between the source electrode 50a and the n$^+$ silicon layer 40a, between the n$^+$ silicon layer 40a and the channel layer 60, between the channel layer 60 and the n$^+$ silicon layer 40b, and between the n$^+$ silicon layer 40b and the drain electrode 50b all become ohmic contacts.

As shown in FIG. 5, if a positive voltage is applied to the drain electrode 50b and a negative voltage is applied to the source electrode 50a, many of the electrons of the source electrode 50a move to the channel layer 60 through the n$^+$ silicon layer 40a. Moreover, the Fermi level of the drain electrode 50b becomes lower by just the voltage applied to the drain electrode 50b, and thus the energy level of the conduction band of the n$^+$ silicon layer 40b also becomes lower. For this reason, the electrons that had moved to the channel layer 60 further move to the drain electrode 50b through the n$^+$ silicon layer 40b. In this manner, the electrons of the source electrode 50a move to the drain electrode 50b through the n$^+$ silicon layer 40a, the vicinity of the channel layer 60 gate electrode 20 side surface, and the n$^+$ silicon layer 40b in that order. As a result, a high ON current flows from the drain electrode 50b to the source electrode 50a of the TFT 10 due to application of voltage between the drain electrode 50b and the source electrode 50a.

Next, the OFF state of the TFT 10 will be described referring to FIG. 6. As shown in FIG. 6, if a negative voltage is applied to the gate electrode 20, the energy level of the end part of the valence band of the gate electrode 20 side of the channel layer 60 becomes higher than the Fermi level. Thus, holes accumulate in the vicinity of the gate electrode 20 side surface of the channel layer 60. On the other hand, in the vicinity of the back channel side surface, there is an accumulation of electrons that were repelled from the vicinity of the gate electrode 20 side surface. As a result, the energy level of the end part of the conduction band approaches the Fermi level at the back channel side. In this state, even if a positive voltage is applied to the drain electrode 50b and a negative voltage is applied to the source electrode 50a, electrons do not accumulate in the vicinity of the gate electrode 20 side surface of the channel layer 60. Thus, even if numerous electrons in the source electrode 50a move to the vicinity of the gate electrode 20 side surface of the channel layer 60, the electrons are soon repelled to the vicinity of the back channel side surface, and the TFT 10 enters the OFF state.

Next, the leak current during the OFF state of the TFT 10 will be described referring to FIGS. 6 and 7. As shown in FIG. 6, due to application of a high negative voltage to the gate electrode 20, at the vicinity of the back channel side surface of the channel layer 60, there is accumulation of electrons repelled from the vicinity of the gate electrode 20 side surface. The respective ends of the back channel side channel layer 60 are electrically connected to the source electrode 50a and drain electrode 50b, respectively, without going through the n$^+$ silicon layers 40a and 40b. Thus, the energy band diagram shown in FIG. 7 differs from the energy band diagram shown in FIG. 5 in that the n$^+$ silicon layers 40a and 40b are not drawn.

At this time, as a result of adjustment such that the Fermi levels of the source electrode 50a, the channel layer 60, and the drain electrode 50b coincide, the energy level of the conduction band of the channel layer 60 becomes just 0.5 eV higher than the Fermi level of the source electrode 50a. Thus, a barrier having a height of 0.5 eV is formed at the boundary between the source electrode 50a and the channel layer 60. In the same manner, a barrier is also formed between the drain electrode 50b and the channel layer 60.

This height of the barrier at the boundary between the source electrode 50a and the channel layer 60 is higher than the barrier at the boundary between the source electrode 50a and the n$^+$ silicon layer 40a when the TFT 10 is in the ON state. Thus, as shown in FIG. 7, even if a positive voltage is applied to the drain electrode 50b and a negative voltage is applied to the source electrode 50a, most of the electrons of the source electrode 50a are unable to cross through this barrier to move to the back channel side of the channel layer 60. However, a small number of electrons move to the back channel side of the channel layer 60 due to the voltage applied between the drain electrode 50b and the source electrode 50a.

The Fermi level of the drain electrode 50b becomes lower by just the voltage applied to the drain electrode 50b, and along with this lowering, the energy level of the conduction band of the drain electrode 50b side of the channel layer 60 also becomes low. However, because few electrons move to the channel layer 60 from the source electrode 50a, few electrons move from the source electrode 50a to the drain electrode 50b. As a result, the leak current coming to the source electrode 50a from the drain electrode 50b of the TFT 10 becomes small and is determined by the voltage applied between the drain electrode 50b and the source electrode 50a.

Figure 8:
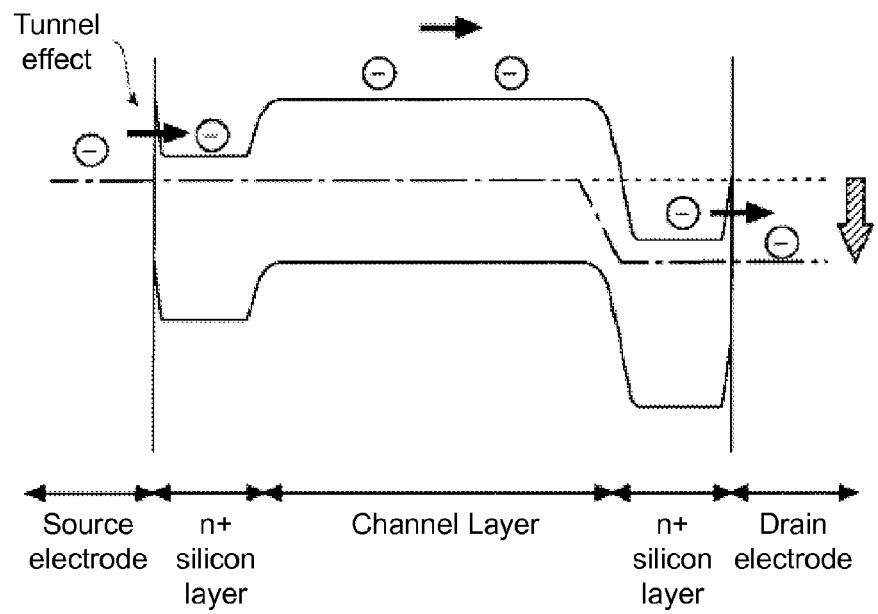
FIG. 8 is an energy band diagram along the C-C line shown in FIG. 3 when the TFT shown in FIG. 2 is in the ON state and when the work function of the source electrode/drain electrode is large.
Figure 9:
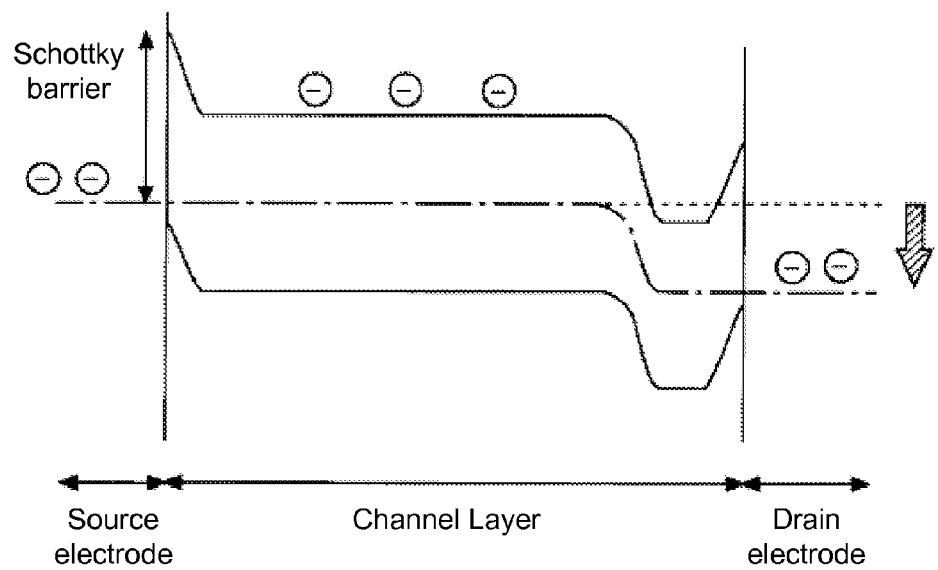
FIG. 9 is an energy band diagram along the D-D line shown in FIG. 3 when the TFT shown in FIG. 2 is in the OFF state and when the work function of the source electrode/drain electrode is large.

Next, a case will be described in which the work functions of the source electrode 50a and the drain electrode 50b are higher than the energy levels of the conduction band of the n$^+$ silicon layers 40a and 40b and the channel layer 60. Here, an example will be cited that uses gold (Au, work function=5.10 eV) as the material of the source electrode 50a and the drain electrode 50b having a work function higher than the energy levels of the conduction bands of the n$^+$ silicon layers 40a and 40b and the channel layer 60. In the below listed description, for simplicity, the work function of gold is assumed to be 5.1 eV, the work functions of the n+ silicon layers 40a and 40b are assumed to be 4.3 eV, and the work function of the intrinsic silicon composing the channel layer 60 is assumed to be 4.6 eV. The energy band diagrams along the B-B line indicated in FIG. 3 when the TFT 10 is in the ON state and in the OFF state are the same as the energy band diagrams shown in FIG. 4 and FIG. 6, respectively, and thus such diagrams are omitted. FIG. 8 is an energy band diagram along the C-C line shown in FIG. 3 when the TFT 10 is in the ON state. FIG. 9 is an energy band diagram along the D-D line shown in FIG. 3 when the TFT 10 is in the OFF state.

First, a case of TFT 10 in the ON state will be described. When a high positive voltage is applied to the gate electrode 20, similarly to the case shown in FIG. 4, the energy level of the end part of the conduction band of the gate electrode 20 side of the channel layer 60 becomes lower than the Fermi level, and electrons accumulate at the vicinity of the gate electrode 20 side surface.

At this time, the conduction band and valence band energy levels of each layer are adjusted such that the Fermi levels of the source electrode 50a, the n+ silicon layer 40a, the channel layer 60, the n+ silicon layer 40b, and the drain electrode 50b coincide. As a result, a Schottky barrier having a height of 0.8 eV is formed at the boundary between the source electrode 50a and the n+ silicon layer 40a and at the boundary between the drain electrode 50b and the n+ silicon layer 40b. However, since the impurity concentrations of the n+ silicon layers 40a and 40b are both very high, i.e., $10^{20}/cm^3$, the width of the depletion layer formed in the n+ silicon layers 40a and 40b becomes very narrow. Thus, the width of the Schottky barrier becomes narrow, and electrons can pass through the Schottky barrier by the tunneling effect.

Moreover, the energy level of the conduction band of the channel layer 60 becomes higher by just 0.3 eV than the respective energy levels of the conduction bands of the n+ silicon layers 40a and 40b, and thus at the boundary between the n+ silicon layer 40a and the channel layer 60 and at the boundary between the n+ silicon layer 40b and the channel layer 60, barriers are formed that have respective heights of 0.3 eV. Thus, the contact between the n+ silicon layer 40a and the channel layer 60 and the contact between the channel layer 60 and the n+ silicon layer 40b both become ohmic contacts.

As shown in FIG. 8, when a positive voltage is applied to the drain electrode 50b and a negative voltage is applied to the source electrode 50a, many of the electrons of the source electrode 50a are unable to climb over the Schottky barrier formed at the boundary between the source electrode 50a and the n+ silicon layer 40a, but electrons in the source electrode 50a can move to the n+ silicon layer 40a due to the tunneling effect.

Most of the electrons that have moved to the n+ silicon layer 40a are able to cross the 0.3 eV high barrier of the boundary between the n+ silicon layer 40a and the channel layer 60 and move to the channel layer 60. Moreover, the Fermi level of the drain electrode 50b becomes lower by just the voltage applied to the drain electrode 50b, and thus the energy level of the conduction band of the n+ silicon layer 40b also becomes lower. For this reason, the electrons that had moved to the channel layer 60 further move to the drain electrode 50b by crossing the n+ silicon layer 40b. In this manner, most of the electrons of the source electrode 50a move to the drain electrode 50b by passing through the n+ silicon layer 40a, the vicinity of the gate electrode 20 side surface of the channel layer 60, and the n+ silicon layer 40b in that order. Thus, a high ON current flows from the drain electrode 50b to the source electrode 50a of the TFT 10.

A case of the TFT 10 in the OFF state will be described next. If a high negative voltage is applied to the gate electrode 20, in the same manner as the case shown in FIG. 6, holes accumulate in the vicinity of the gate electrode 20 side surface of the channel layer 60, and in the vicinity of the back channel side surface, the electrons repelled from the vicinity of the gate electrode 20 side surface accumulate. In this state, even when a positive voltage is applied to the drain electrode 50b and a negative electrode is applied to the source electrode 50a, electrons do not accumulate in the vicinity of the gate electrode 20 side surface of the channel layer 60. Thus, even if the electrons in the source electrode 50a move to the vicinity of the gate electrode 20 side surface of the channel layer 60, these electrons are soon repelled toward the vicinity of the back channel side surface, and the TFT 10 enters the OFF state.

The leak current during the OFF state of the TFT 10 will be described next. Due to application of a high negative voltage to the gate electrode 20, in the same manner as the case shown in FIG. 6, electrons repelled from the vicinity of the gate electrode 20 side surface accumulate in the vicinity of the back channel side surface of the channel layer 60. The respective ends of the back channel side channel layer 60 are connected to the source electrode 50a and the drain electrode 50b, respectively, without going through the n+ silicon layers 40a and 40b.

At this time, as a result of the Fermi level of the source electrode 50a and the Fermi level of the channel layer 60 having been adjusted so as to coincide with each other, a Schottky barrier that is 0.5 eV high is formed at the boundary between the source electrode 50a and the channel layer 60. In the same manner, a Schottky barrier having a height of 0.5 eV is formed at the boundary between the drain electrode 50b and the channel layer 60.

As shown in FIG. 9, even if a positive voltage is applied to the drain electrode 50b and a negative voltage is applied to the source electrode 50a, many of the electrons of the source electrode 50a are unable to climb over the Schottky barrier to move to the back channel side of the channel layer 60. Moreover, since there are almost no impurities included in the channel layer 60 formed of intrinsic silicon, the width of the Schottky barrier, as shown in FIG. 9, becomes wider than the width of the Schottky barrier shown in FIG. 8. Thus, the electrons in the source electrode 50a cannot pass through the Schottky barrier by the tunneling effect either. Furthermore, the Fermi level of the drain electrode 50b becomes lower by just the voltage applied to the drain electrode 50b, and thus the energy of the conduction band of the drain electrode 50b side channel layer 60 also becomes low. However, a wide Schottky barrier having a height of 0.5 eV is formed at the boundary between the channel layer 60 and the drain electrode 50b. Thus, most of electrons cannot move from the channel layer 60 to the drain electrode 50b. As a result, it is possible to lower the leak current flowing from the drain electrode 50b to the source electrode 50a of the TFT 10.

1.3 Method of Manufacture of TFT

Figure 10:
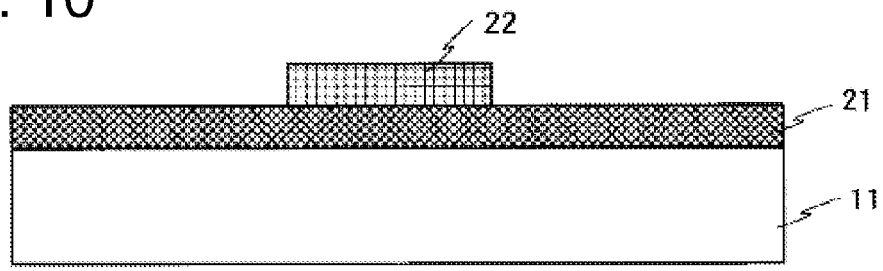
FIG. 10 is a process cross-sectional drawing showing the manufacturing process of the TFT shown in FIG. 2.

FIGS. 10 to 18 are process cross-sectional drawings showing the various manufacturing steps of the TFT 10 of the first embodiment of the present invention. As shown in FIG. 10, the sputtering method is used to form a stacked metal film 21 by stacking on an insulating substrate 11 (e.g., glass substrate or the like) a 50 nm thick titanium film, a 100 nm thick aluminum film, and a 50 nm thick titanium film in that order. Using the photolithographic method, a resist pattern 22 is formed on the upper surface of the stacked metal film 21.

Then, by using the dry etching method utilizing the resist pattern 22 as a mask, while adjusting the etching conditions for each etched layer, the stacked metal film 21 is etched from the upper layer in turn.

Figure 11:
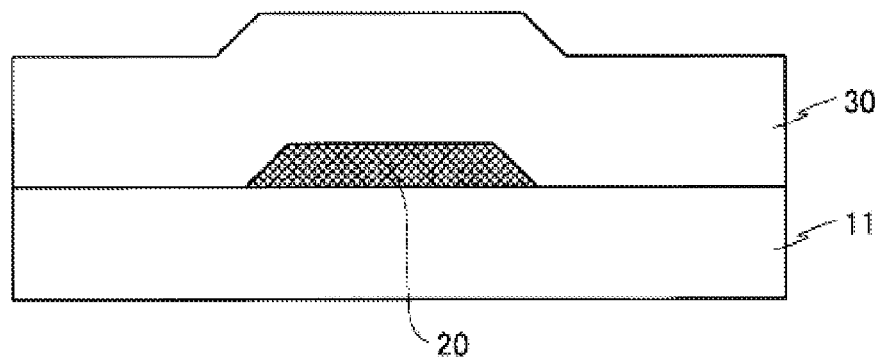
FIG. 11 is a process cross-sectional drawing showing the manufacturing process of the TFT shown in FIG. 2.

As shown in FIG. 11, after the formation of the gate electrode 20 by the dry etching method, the resist pattern 22 on the gate electrode 20 is peeled off. Using the plasma enhanced chemical vapor deposition method (referred to hereinafter as the plasma CVD method), on the insulating substrate 11 including the gate electrode 20, a gate insulation film 30 is formed of silicon nitride (SiNx) or silicon oxide (SiO2), for example. The thickness of the gate insulation film 30 is 400 nm, for example.

Figure 12:
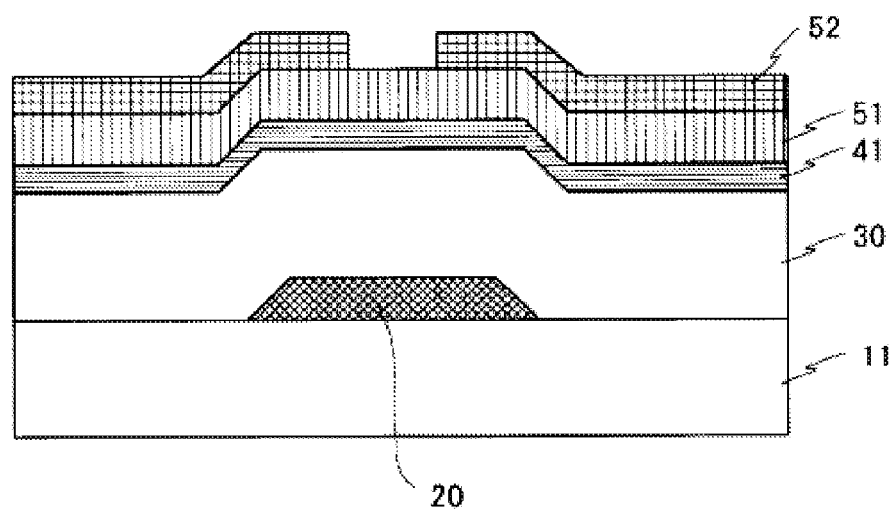
FIG. 12 is a process cross-sectional drawing showing the manufacturing process of the TFT shown in FIG. 2.

As shown in FIG. 12, an $n^+$ silicon film 41 (i.e., silicon film doped with a high concentration of an n-type dopant such as phosphorus (P) or the like) is formed using the plasma CVD method. The thickness of the $n^+$ silicon film 41 is 50 nm, for example, and the concentration of the n-type dopant is about $10^{20}/cm^3$. Next, the sputtering method is used to form a stacked metal film 51 by stacking on the upper surface of the $n^+$ silicon film 41 a 50 nm thick titanium film, a 100 nm thick aluminum film, and a 50 nm thick titanium film in that order. Then, the photolithography method is used to form a resist pattern 52 having an opening part above the gate electrode 20 on the upper surface of the stacked metal film 51.

Figure 13:
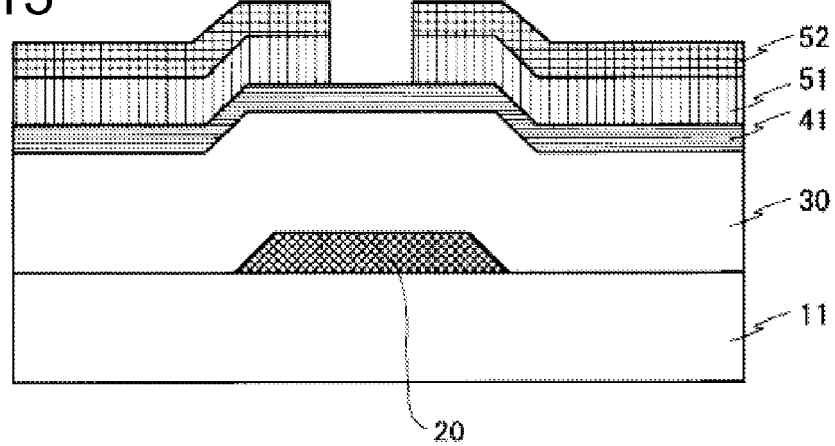
FIG. 13 is a process cross-sectional drawing showing the manufacturing process of the TFT shown in FIG. 2.
Figure 14:
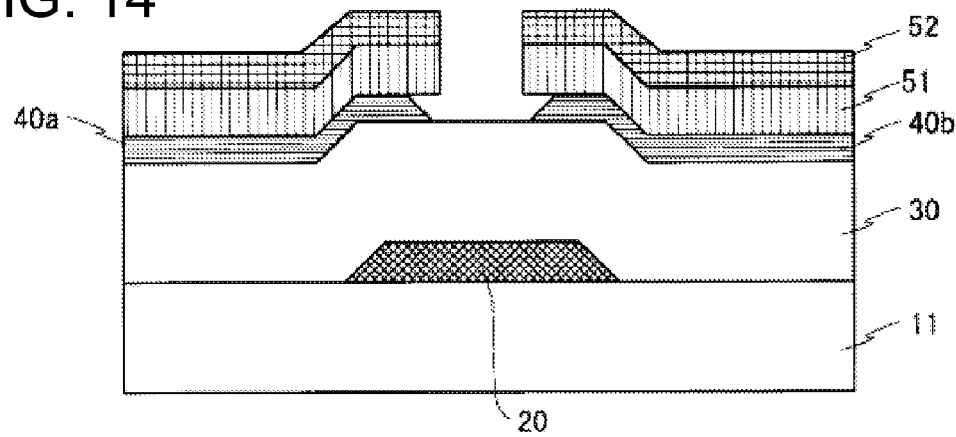
FIG. 14 is a process cross-sectional drawing showing the manufacturing process of the TFT shown in FIG. 2.

As shown in FIG. 13, the stacked metal film 51 is etched by the dry etching method using the resist pattern 52 as a mask. As a result, the ends of the stacked metal film 51 separated laterally above the gate electrode 20 become substantially coplanar with the respective ends of the resist pattern 52. Thereafter, as shown in FIG. 14, the $n^+$ silicon film 41 is etched by the dry etching method using the resist pattern 52 as a mask to form the laterally separated $n^+$ silicon layers 40a and 40b. By adjustment of etching conditions during the etching of the $n^+$ silicon film 41, etching is performed under conditions such that the tip parts assume a tapered shape. The preferred angle formed in the taper is about 45°. Furthermore, rather than etching of the stacked metal film 51 and the $n^+$ silicon film 41 by the dry etching method, etching may be performed by the wet etching method, or alternatively, one of the films among these films may be etched by the dry etching method, and the other film may be etched by the wet etching method.

Figure 15:
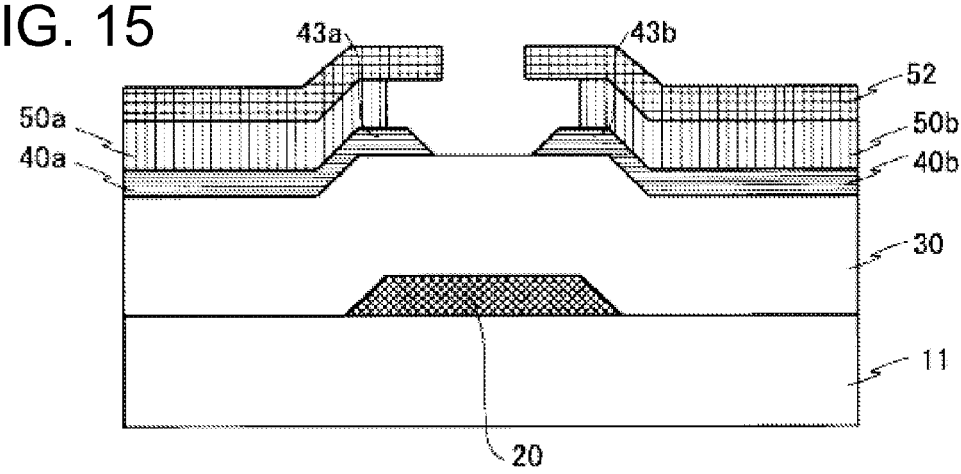
FIG. 15 is a process cross-sectional drawing showing the manufacturing process of the TFT shown in FIG. 2.

As shown in FIG. 15, using the resist pattern 52 as a mask, the stacked metal film 51 is subjected to supplementary etching by the wet etching method. Furthermore, among the metal films composing the stacked metal film 51, the titanium film is etched using a hydrofluoric acid type etchant, and the aluminum film is etched using an etchant that includes phosphoric acid ($H_3PO_4$), acetic acid ($CH_3COOH$), and nitric acid ($HNO_3$). Because of the supplementary etching, the end of the stacked metal film 51 is shifted from the end of the resist pattern 52, and the source electrode 50a and the drain electrode 50b are formed. The amount of shift by the stacked metal film 51 from the end of the resist pattern 52 is 1 to 2 μm, for example. As a result, the $n^+$ silicon layers 40a or 40b protrude from the ends of the source electrode 50a and drain electrode 50b, respectively, by 1 to 2 μm. Thus, the protrusion parts 43a and 43b extend in a length of 1 to 2 μm on the gate insulation film 30 sandwiched between the source electrode 50a and the drain electrode 50b. Because the protrusion parts 43a and 43b of the $n^+$ silicon layers 40a and 40b are formed by performing supplemental etching using the resist pattern 52 that has been used during patterning of the stacked metal film 51, there is no need to use an additional mask.

Figure 16:
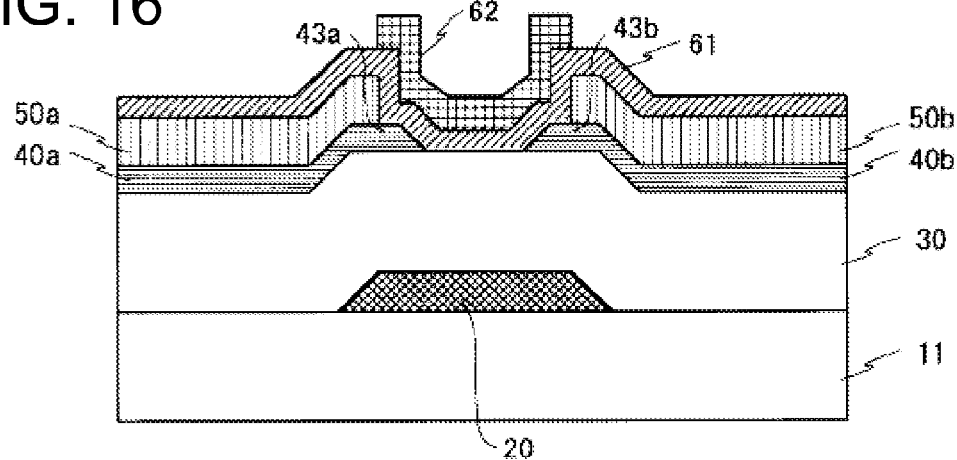
FIG. 16 is a process cross-sectional drawing showing the manufacturing process of the TFT shown in FIG. 2.

As shown in FIG. 16, the resist pattern 52 is peeled off, and the high density plasma CVD method is used to form a 100 nm thick microcrystalline silicon film 61 on the insulating substrate 11 that includes the source electrode 50a and the drain electrode 50b. A CVD apparatus of the inductive coupling plasma type, surface wave plasma type, or the like is used for the high density plasma CVD method. The microcrystalline silicon layer 61 is formed using hydrogen and mono-silane as raw material gases and by properly adjusting the internal pressure in the chamber and the flow rate ratios of mono-silane and hydrogen. Alternatively, the microcrystalline silicon film 61 may be formed by forming an amorphous silicon film by the plasma CVD method, and then using an excimer laser to irradiate the amorphous silicon film. Then, the photolithography method is used to form a resist pattern 62 on the upper surface of the microcrystalline silicon film 61 sandwiched between the source electrode 50a and the drain electrode 50b.

Figure 17:
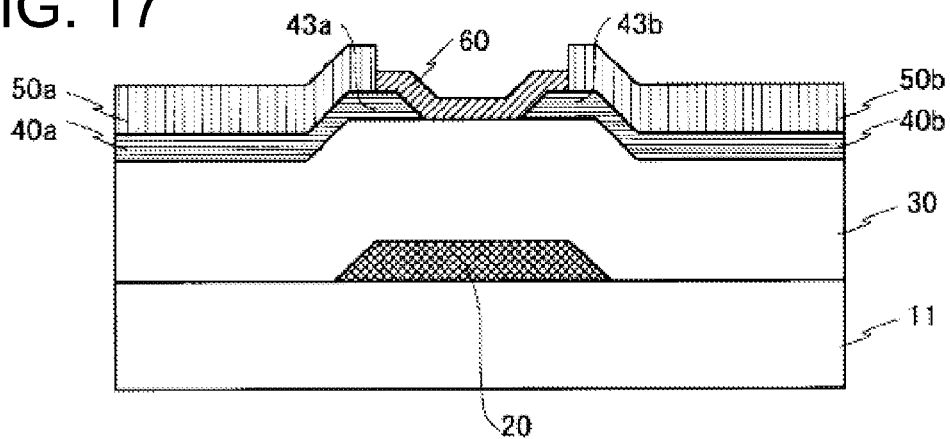
FIG. 17 is a process cross-sectional drawing showing the manufacturing process of the TFT shown in FIG. 2.
Figure 18:
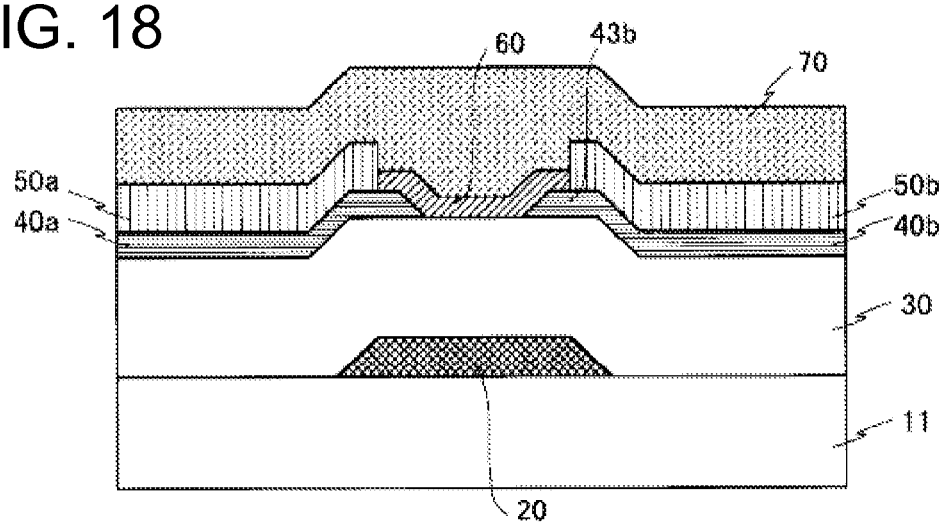
FIG. 18 is a process cross-sectional drawing showing the manufacturing process of the TFT shown in FIG. 2.

As shown in FIG. 17, using the resist pattern 62 as a mask, the microcrystalline silicon film 61 is etched by the dry etching method to form an island-shaped channel layer 60 in the region sandwiched by the source electrode 50a and the drain electrode 50b. In the region sandwiched between the source electrode 50a and the drain electrode 50b, the upper surfaces of the protrusion parts 43a and 43b of the $n^+$ silicon layers 40a and 40b are respectively electrically connected to the bottom surface of the channel layer 60. Next, as shown in FIG. 18, the resist pattern 62 is peeled off, and the plasma CVD method is used to form a protective film 70 made of silicon nitride so as to cover the entire insulating substrate 11. The thickness of the protective film 70 is set to 250 nm, for example. The TFT 10 is manufactured by the aforementioned process.

1.4 Results

Figure 19:
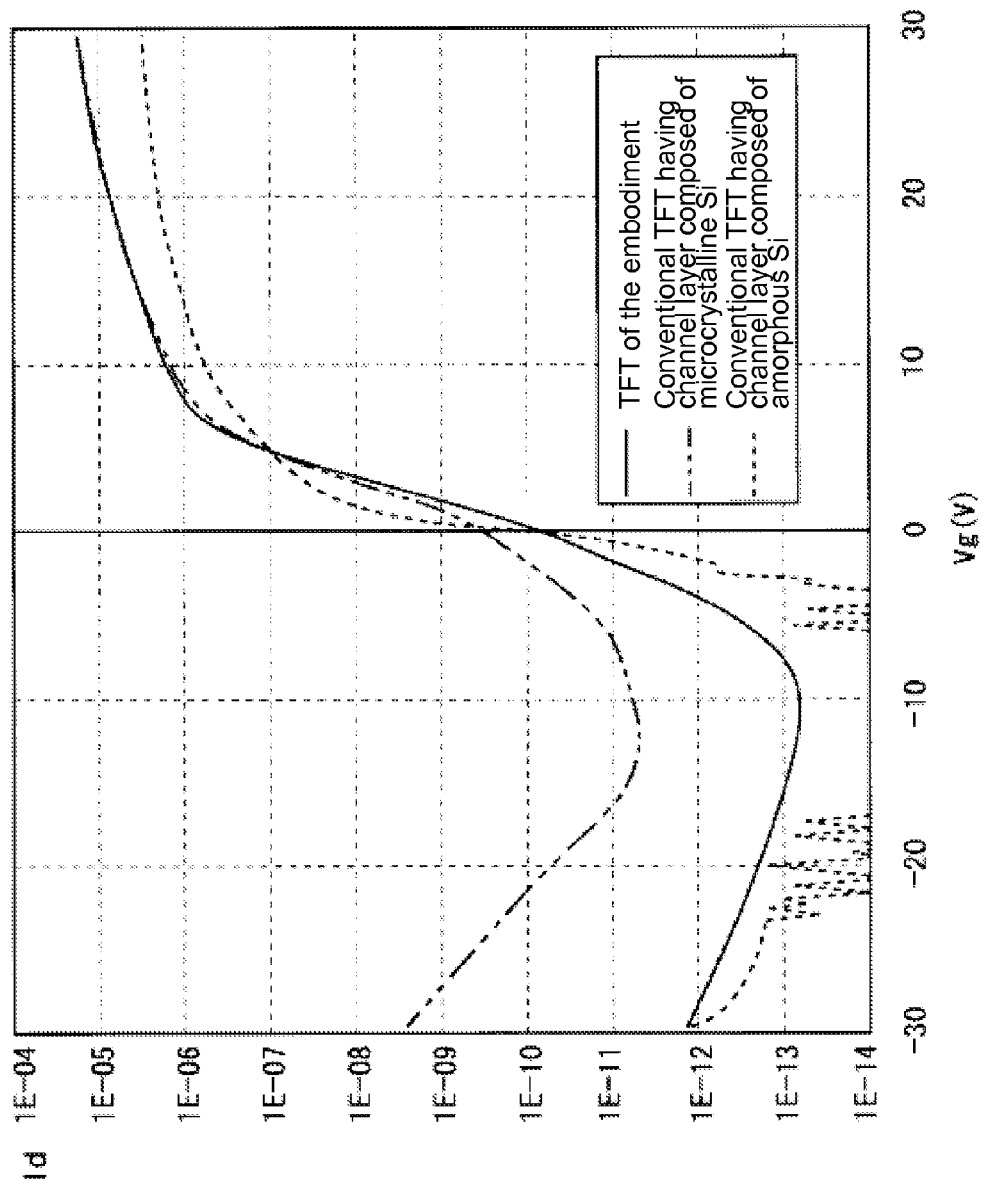
FIG. 19 is a chart showing the gate voltage-drain current characteristics of the TFT shown in FIGS. 1 and 2.
Figure 32:
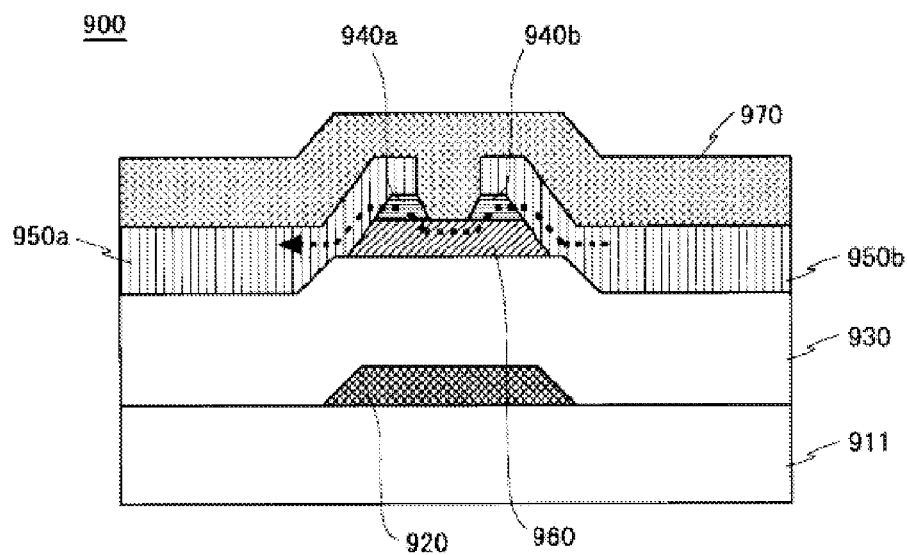
FIG. 32 is a cross-sectional drawing showing the structure of a conventional TFT.

FIG. 19 is a graph showing the gate voltage Vg-drain current Id characteristics of the TFT 10 shown in FIGS. 1 and 2. Within FIG. 19 are shown the ON characteristics and OFF characteristics of the TFT 900 shown in FIG. 32 (having a channel layer 960 made of microcrystalline silicon), a conventional TFT formed using amorphous silicon for the channel layer 960 of the TFT 900, and the TFT 10 of the first embodiment. Here, the ON current and the OFF current are included in the drain current Id shown in FIG. 19.

As shown in FIG. 19, in comparison to the TFT composed of amorphous silicon, the ON current of the TFT 900 was made high, but the leak current also becomes high. In the TFT 10 of the first embodiment, the ON current about as high as that of the TFT 900 was achieved, and it was also possible to decrease the OFF current down to a level about that of the TFT composed of amorphous silicon.

1.5 Shape of the Ends of Source Electrode/Drain Electrode and $n^+$ Silicon Layers In the TFT 10 of the aforementioned first embodiment, the protrusion parts 43a and 43b of the $n^+$ silicon layers 40a and 40b that have the ends assuming a tapered shape extend over the gate insulation film 30 sandwiched between the source electrode 50a and the drain electrode 50b, and the ends of the source electrode 50a and the drain electrode 50b are roughly perpendicular to the gate insulation film 30. However, various other combinations for the shape of the ends of the source electrode 50a and the drain electrode 50b and the shape of the ends of the $n^+$ silicon layers 40a and 40b are possible. FIGS. 20 to 24 are cross-sectional drawings of various types of TFTs 100 to 500 having various combinations in the shapes of the ends of the source electrode 50a and the drain electrode 50b and the shapes of the ends of the $n^+$ silicon layers 40a and 40b.

Here, among the structural elements of the TFTs 100 to 500, structural elements that are the same as those of the TFT 10, or structural elements corresponding to such parts, are assigned reference symbols corresponding to the reference symbols assigned for the TFT 10.

Figure 20:
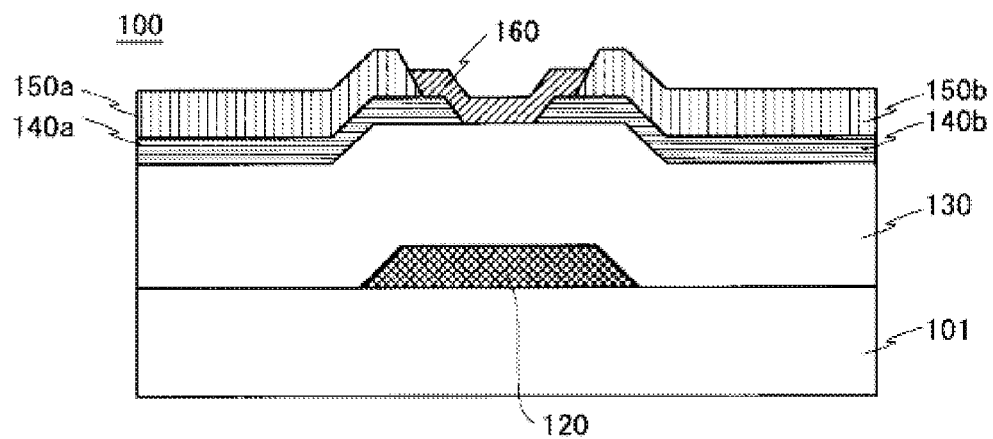
FIG. 20 is a cross-sectional drawing showing an example of a combination of the shape of the ends of the source electrode and drain electrode and the shape of the end of the $n^+$ silicon layer in a TFT.

The TFT 100 shown in FIG. 20 differs from the TFT 10 of the aforementioned first embodiment in that, in addition to the ends of the $n^+$ silicon layers 140$a$ and 140$b$, the ends of the source electrode 150$a$ and the drain electrode 150$b$ also assume tapered shapes.

Figure 21:
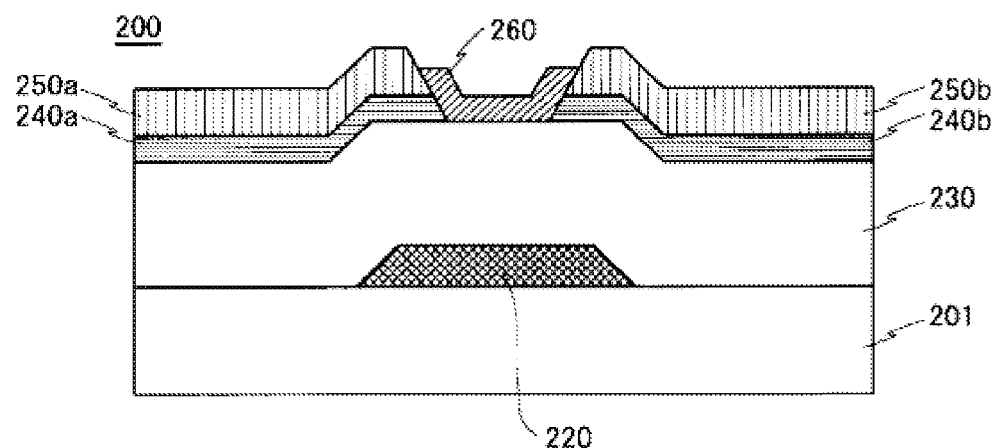
FIG. 21 is a cross-sectional drawing showing an example of a combination of the shape of the ends of the source electrode and drain electrode and the shape of the end of the $n^+$ silicon layer in a TFT.

The TFT 200 shown in FIG. 21 differs from the TFT 100 shown in FIG. 20 in that the tapered edge of the source electrode 205$a$ is formed so as to be continuously connected to the tapered edge of the $n^+$ silicon layer 240$a$, and the tapered edge of the drain electrode 250$b$ is formed so as to be continuously connected to the tapered edge of the $n^+$ silicon layer 240$b$. In this case, the ends of the source electrode 250$a$ and the drain electrode 250$b$ during patterning are etched to result in tapered shapes, and thus there is no need for a supplemental etching step to etch back the ends of the source electrode 250$a$ and the drain electrode 205$b$ as indicated in FIG. 15 of the aforementioned first embodiment. Therefore, the manufacturing process of the TFT 200 can be simplified. Moreover, since a protrusion part is not formed in the TFT 200, the channel layer 260 is connected electrically only to the ends of the $n^+$ silicon layers 240$a$ and 240$b$.

Figure 22:
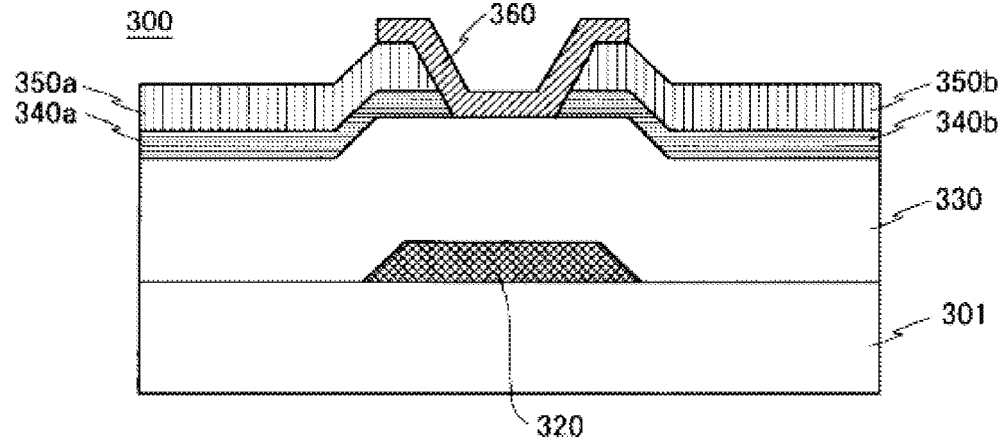
FIG. 22 is a cross-sectional drawing showing an example of a combination of the shape of the ends of the source electrode and drain electrode and the shape of the end of the n$^+$ silicon layer in a TFT.
Figure 23:
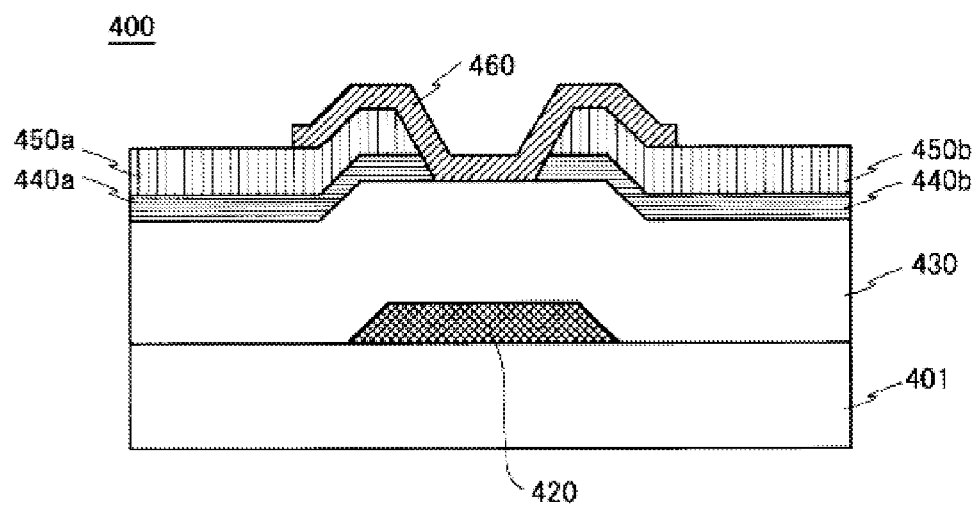
FIG. 23 is a cross-sectional drawing showing an example of a combination of the shape of the ends of the source electrode and drain electrode and the shape of the end of the n$^+$ silicon layer in a TFT.

The TFT 300 shown in FIG. 22 differs from the TFT 200 shown in FIG. 21 in that the ends of the channel layer 360 extend beyond the region sandwiched between the source electrode 350$a$ and the drain electrode 350$b$ and extend as far as the upper surfaces of the source electrode 350$a$ and the drain electrode 350$b$. In this case, the channel layer 360 can be readily formed even when the gate electrode 320 is narrow. The TFT 400 shown in FIG. 23 has a channel layer 460 having its ends extending further toward the outside on the upper surfaces of the source electrode 450$a$ and drain electrode 450$b$, even more so than in the case of the TFT 300 shown in FIG. 22. In this case, the length of the channel layer 460 in a plan view becomes longer than the width of the gate electrode 420. For this reason, the channel layer 460 can be readily formed even when the width of the gate electrode 420 is reduced.

Figure 24:
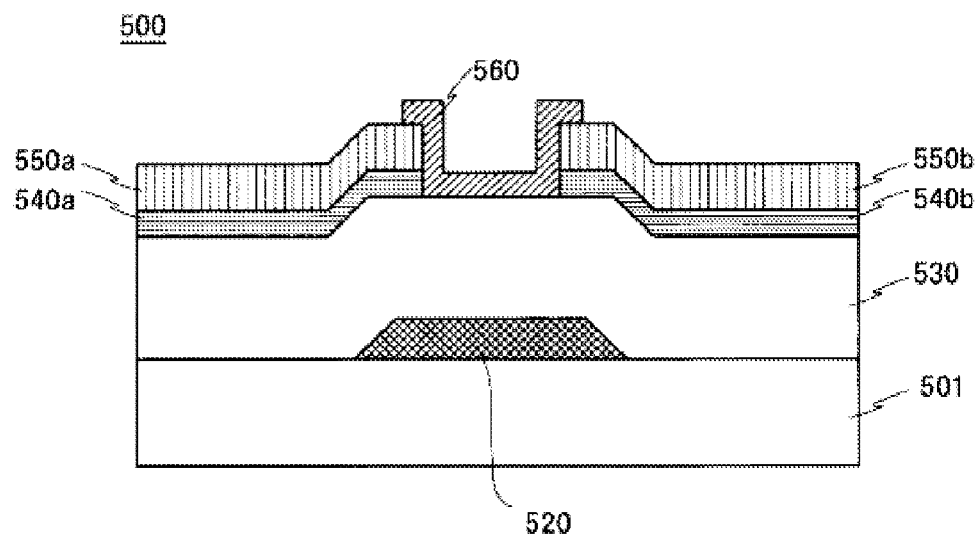
FIG. 24 is a cross-sectional drawing showing an example of a combination of the shape of the ends of the source electrode and drain electrode and the shape of the end of the n$^+$ silicon layer in a TFT.

The TFT 500 shown in FIG. 24 differs from the TFT 10 of the aforementioned first embodiment in that not merely the ends of the source electrode 550$a$ and the drain electrode 550$b$, but also the ends of the silicon layer 540$a$ and 540$b$ are formed so as to be substantially perpendicular to the gate insulation film 530. Moreover, the ends of the source electrode 550$a$ and the $n^+$ silicon layer 540$a$ as well as the ends of the drain electrode 550$b$ and the $n^+$ silicon layer 540$b$ are respectively formed so as to become coplanar with each other. Moreover, the respective ends of the channel layer 560 are formed so as to extend as far as the upper surface of the source electrode 550$a$ and the upper face of the drain electrode 550$b$, respectively. Alternatively, the channel layer 560 may be formed so as to be contained within the region sandwiched between the source electrode 550$a$ and the drain electrode 550$b$.

2. Embodiment 2

Figure 25:
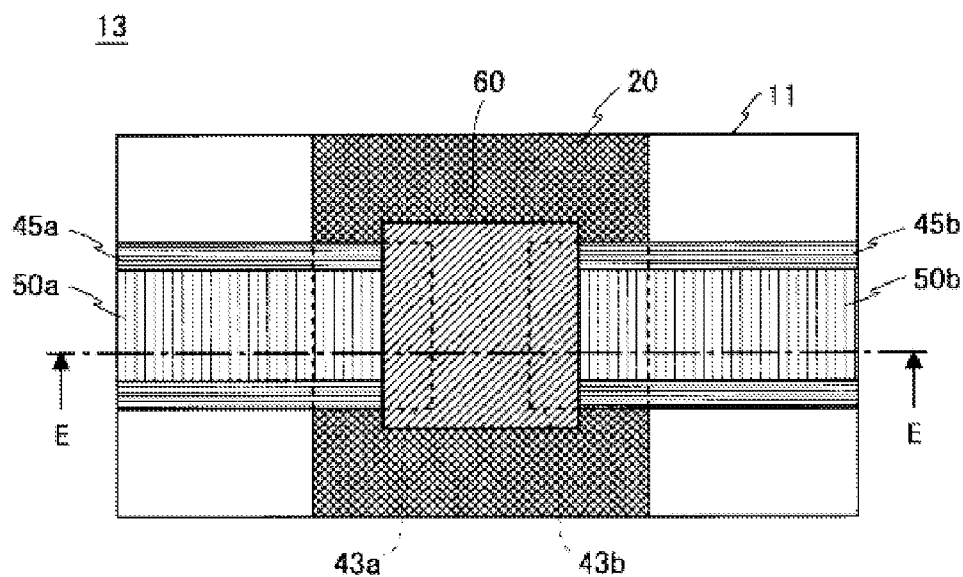
FIG. 25 is a plan view showing the structure of a TFT according to a second embodiment of the present invention.
Figure 26:
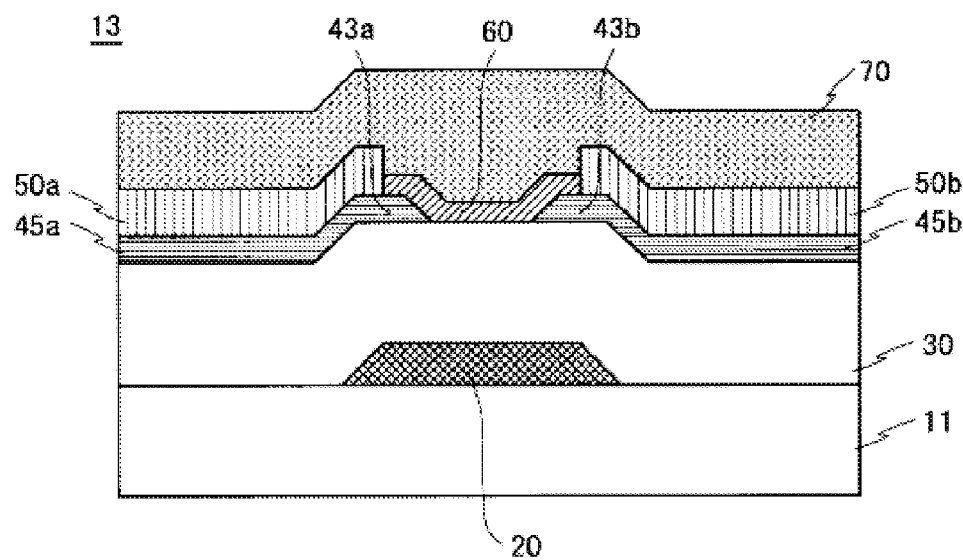
FIG. 26 is a cross-sectional drawing of the TFT cut at the E-E line shown in FIG. 25.

Although an n-channel type TFT is described in the aforementioned first embodiment, a p-channel type TFT 13 may also be used. Thus, a p-channel type TFT 13 will be described. FIG. 25 is a plan view showing the structure of a TFT 13 that is related to the second embodiment of the present invention. FIG. 26 is a cross-sectional drawing of the TFT 13 sliced at the E-E line shown in FIG. 25. The structure of the p-channel type TFT 13 will be described by referring to FIGS. 25 and 26. The TFT 13 differs from the TFT 10 in that $p^+$ silicon layers 45$a$ and 45$b$ are formed, in place of the $n^+$ silicon layers 40$a$ and 40$b$, to act as the source region and drain region, respectively. However, other structural elements of the TFT 13 are the same as the structural elements of TFT 10, so reference symbols are assigned in FIGS. 25 and 26 that are the same as those of the same structural elements shown in FIGS. 1 and 2, and a description of these elements is therefore omitted.

In this second embodiment, a description of the ON state of TFT 13 will be omitted, and the leak current in the OFF state will be described. Since the TFT 13 is a p-channel type TFT, in order to put the TFT 13 in the OFF state, a positive voltage is first applied to the gate electrode 20. As a result, holes acting as carriers are repelled from the vicinity of the gate electrode 20 side surface of the channel layer 60 and gather in the vicinity of the back channel side surface. Thus, the leak current passes from the source electrode 50$a$ to the drain electrode 50$b$ by passing through the vicinity of the back channel side surface of the channel layer 60. Furthermore, in the TFT 13, in the same manner as in the TFT 10, the energy band diagrams depend on the magnitude relationship between the value of the electron affinity of the intrinsic silicon composing the channel layer 60 added to the width of the bandgap (sometimes referred to as "energy level of the valence band") and the work function of the metal composing the source electrode 50$a$ and the drain electrode 50$b$, and thus respective cases will be described in turn.

Figure 27:
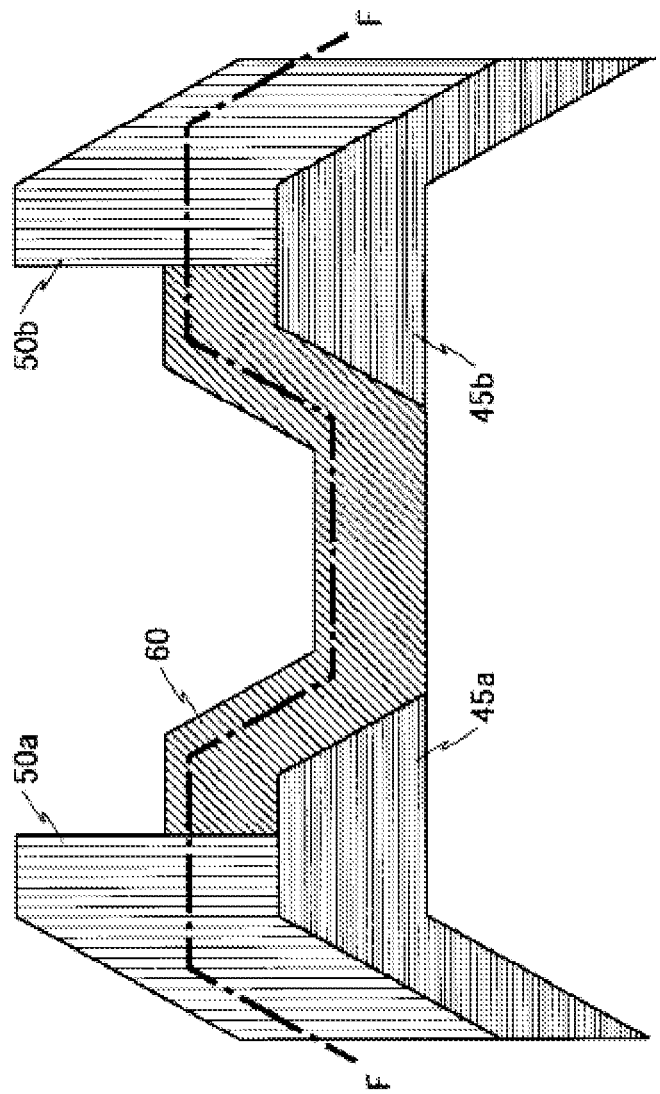
FIG. 27 is a magnified cross-sectional drawing of the vicinity of the channel layer of the TFT shown in FIG. 26.
Figure 28:
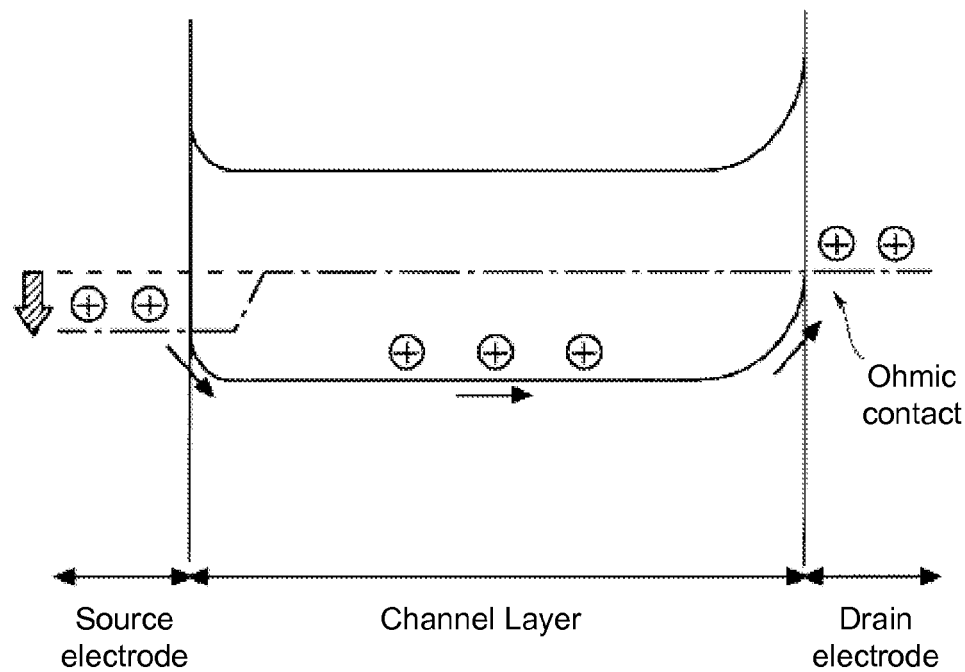
FIG. 28 is an energy band diagram along the F-F line shown in FIG. 27 when the TFT is in the OFF state.

First, a case will be described in which the work function of the metal composing the source electrode 50$a$ and the drain electrode 50$b$ is greater than the energy level of the valance band of the intrinsic silicon composing the channel layer 60. FIG. 27 is a magnified cross-sectional drawing of the vicinity of the channel layer 60 of the TFT 13 shown in FIG. 26. FIG. 28 is an energy band diagram along the F-F line shown in FIG. 27 when the TFT 13 is in the OFF state. Referring to FIG. 28, the leak current flowing through the vicinity of the back channel side surface of the channel layer 60 when the TFT 13 is in the OFF state will be described. A high positive voltage is applied to the gate electrode 20 in order to switch the TFT 13 to the OFF state. Thus, in the vicinity of the back channel side surface of the channel layer 60, holes that were repelled from the vicinity of the gate electrode 20 side surface accumulate. The respective ends of the back channel side channel layer 60 are electrically connected to the source electrode 50$a$ and the drain electrode 50$b$, respectively.

At this time, the energy levels of the conduction band and the valance band of the channel layer 60 are adjusted so that the Fermi levels of the source electrode 50$a$, the channel layer 60, and the drain electrode 50$b$ coincide. As a result, the energy level of the valance band of the channel layer 60 becomes lower than the Fermi levels of the drain electrode 50$b$ and the source electrode 50$a$, and a barrier is formed at the boundary between the source electrode 50$a$ and the channel layer 60. Similarly, a barrier is also formed at the boundary between the drain electrode 50$b$ and the channel layer 60. Although the height of these barriers are higher than the height of the barriers when the TFT is in the ON state, the height is such that holes acting as carriers can climb over the barriers due to a voltage applied between the drain electrode 50$b$ and the source electrode 50$a$. Thus, the contact between the source electrode 50$a$ and the channel layer 60 and the contact between the drain electrode 50$b$ and the channel layer 60 are both ohmic contacts. However, the height of the barriers becomes higher than when the TFT 13 is in the ON state.

As shown in FIG. 28, if a positive voltage is applied to the source electrode 50a, the Fermi level of the source electrode becomes lowered by just the applied voltage, and thus the height of the barrier formed at the boundary between the source electrode 50a and the channel layer 60 becomes low. Thus holes readily move from the source electrode 50a to the channel layer 60. However, due to the lack of change in the height of the barrier formed at the boundary between the channel layer 60 and the drain electrode 50b, movement of the holes of the channel layer 60 to the drain electrode is restricted, and few holes move to the drain electrode. As a result, the leak current flowing from the source electrode 50a to the drain electrode 50b of the TFT 13 becomes small, and this leak current is determined by the voltage applied between the drain electrode 50b and the source electrode 50a.

Figure 29:
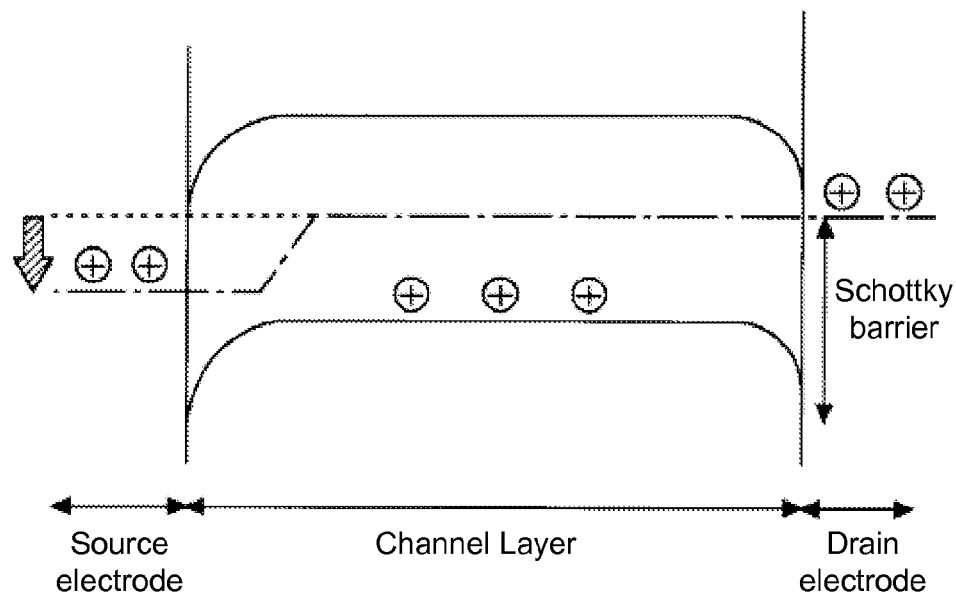
FIG. 29 is an energy band diagram along the F-F line shown in FIG. 27 when the TFT is in the OFF state.

Next, a case will be described in which the work function of the metal composing the source electrode 50a and the drain electrode 50b is smaller than the energy level of the valance band of the intrinsic silicon composing the channel layer 60. FIG. 29 is an energy band diagram along the F-F line shown in FIG. 27 when the TFT 13 is in the OFF state. Referring to FIG. 29, the leak current will be described for the case where the TFT 13 is in the OFF state. A high positive voltage is applied to the gate electrode 20 in order to switch the TFT 13 to the OFF state. Thus, in the vicinity of the back channel side surface of the channel layer 60, holes that were repelled from the vicinity of the gate electrode 20 side surface accumulate. Respective ends of the back channel side channel layer 60 are electrically connected to the source electrode 50a and the drain electrode 50b, respectively.

At this time, the Fermi level of the source electrode 50a and the Fermi level of the channel layer 60 are adjusted so as to coincide with each other, and thus a Schottky barrier is formed at the boundary between the source electrode 50a and the channel layer 60. Similarly, a Schottky barrier is formed at the boundary between the drain electrode 50b and the channel layer 60. These Schottky barriers are very high, and thus holes are unable to climb up the Schottky barrier. Due to the channel layer 60 being formed of intrinsic silicon that has a low impurity concentration, the Schottky barrier does not become narrow. Thus, holes cannot pass through the Schottky barrier even with the tunneling effect.

If a positive voltage is applied to the source electrode 50a as shown in FIG. 29, the Fermi level of the source electrode 50a is reduced by just the applied voltage, and thus the height of the Schottky barrier at the boundary between the source electrode 50a and the channel layer 60 becomes lowered by just that applied voltage. For this reason, in comparison to prior to application of the positive voltage, holes become just slightly more readily movable from the source electrode 50a to the channel layer 60. However, the height of the Schottky barrier at the boundary between the channel layer 60 and the drain electrode 50b does not change, and thus holes of the channel layer 60 are prevented from moving to the drain electrode 50b by the Schottky barrier so that most of the holes are unable to move to the drain electrode 50b. As a result, it is possible to reduce the leak current flowing from the source electrode 50a to the drain electrode 50b of the TFT 13.

3. Applications to Liquid Crystal Display

Figure 30:
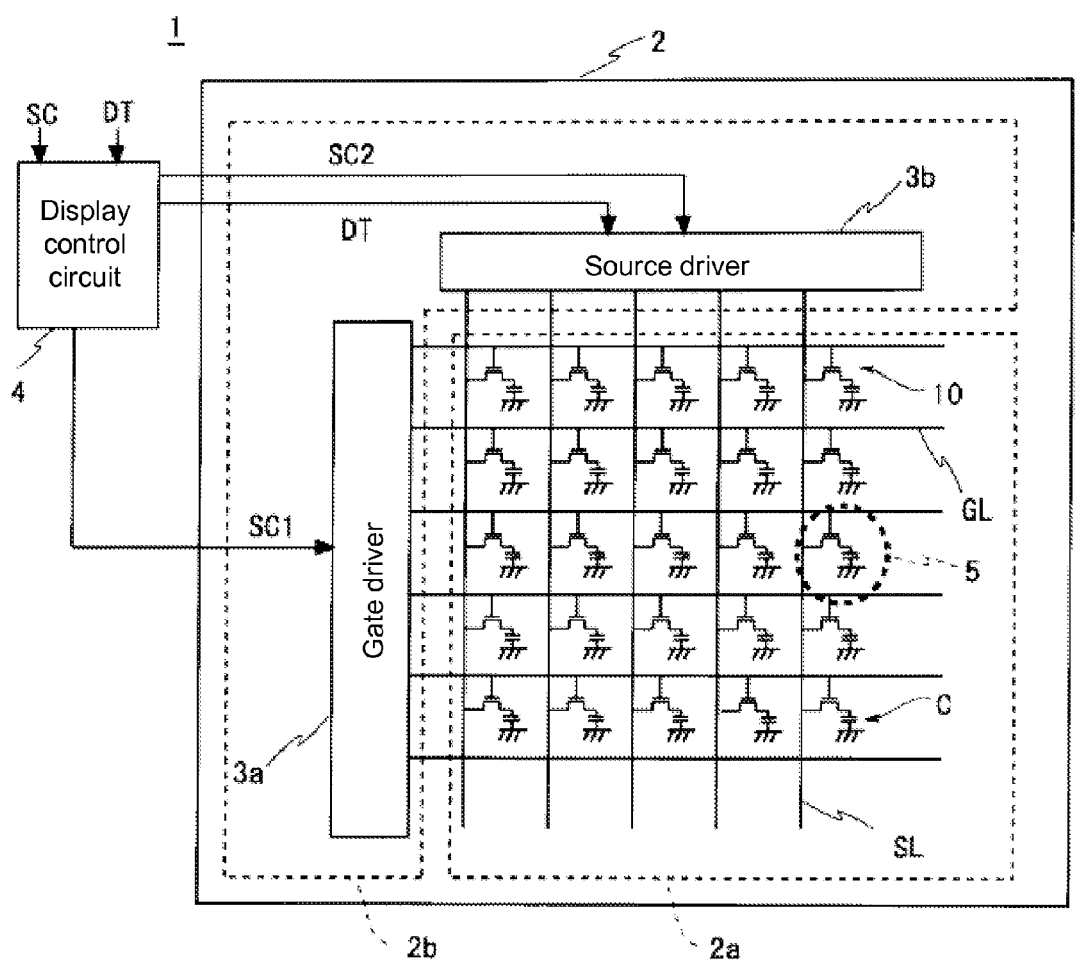
FIG. 30 is a block diagram showing the structure of a liquid crystal display.

FIG. 30 is a block diagram showing the configuration of a liquid crystal display 1. The liquid crystal display 1 shown in FIG. 30 includes a liquid crystal panel 2 and a display control circuit 4. A pixel area 2a and a driver area 2b are provided in the liquid crystal panel 2. Multiple gate lines GL extending in the horizontal direction and multiple source lines SL extending in the direction orthogonal to the gate lines GL are formed in the pixel area 2a. A pixel formation part 5 is disposed in the vicinity of the intersection point of the gate line GL and the source line SL. The pixel formation part 5 includes a TFT 10 functioning as a switching element and a liquid crystal capacitance C for retaining the image signal for a certain period of time. The gate electrode of the TFT 10 is connected to a gate line GL, and the source electrode is connected to a source line SL. The drain electrode is connected to a pixel electrode constituting the liquid crystal capacitance C.

A control signal SC, such as horizontal synchronization signal, vertical synchronization signal, and the like, and an image signal DT are supplied from the exterior of the liquid crystal display 1 to the display control circuit 4. The display control circuit 4, based on these control signals, outputs a control signal SC1 to the gate driver 3a formed in the driver area 2b, and outputs the image signal DT and a control signal SC2 to the source driver 3b.

The gate driver 3a and the source driver 3b are driver monolithic circuits formed on the insulating substrate using microcrystalline silicon. The gate driver 3a is connected to each of the gate lines GL, and the source driver 3b is connected to each of the source lines SL. The gate driver 3a sends to the gate line GL a high level signal indicating the selected state. The gate lines GL are selected in sequence one at a time, and a single row of the pixel formation parts 5 are activated and selected. The source driver 3b applies a voltage corresponding to the image signal DT to the source line SL. This way, voltages corresponding to the image signal DT are written to the selected single row portion of the pixel formation parts 5. In this manner, the liquid crystal display 1 displays an image in the pixel area 2a of the liquid crystal panel 2.

Figure 31:
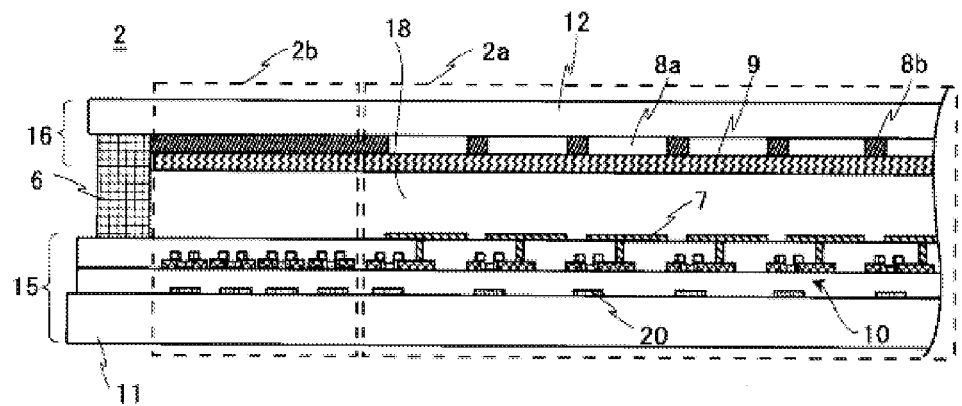
FIG. 31 is a cross-sectional drawing of a liquid crystal panel that includes the liquid crystal display shown in FIG. 30.

FIG. 31 is a cross-sectional drawing of the liquid crystal panel 2. As shown in FIG. 31, the liquid crystal panel 2 includes two opposingly disposed insulating substrates 11 and 12. ON the insulating substrate 11, pixel formation parts including the TFT 10 are formed in a matrix pattern, and this substrate is referred to as the TFT substrate 15. On the insulating substrate 12, color filters 8a, an opposing electrode 9, and the like are formed, and this substrate is referred to as the CF substrate 16. The gate driver 3a and the source driver 3b are formed in the driver area 2b of the TFT substrate 15. Moreover, a liquid crystal layer 18 sealed by a sealant 6 is retained in the space sandwiched between the TFT substrate 15 and CF substrate 16.

A gate electrode 20 for the corresponding TFT 10 is formed on the TFT substrate 15, and a source electrode, a drain electrode, and a channel layer of the TFT 10 are formed above the gate electrode 20. On the surface of the pixel area 2a of the TFT substrate 15, pixel electrodes 7 that are connected to the drain electrodes of the TFTs 10 are further formed. On the surface of the CF substrate 16 facing the TFT substrate 15, color filters 8a are formed in the color of red, green, and blue, respectively, corresponding to the positions of the TFTs 10 of the pixel area 2a. A black matrix 8b is formed between adjacent color filters 8a. A counter electrode 9 is formed so as to cover the color filters 8a and the black matrix 8b surface (lower face in FIG. 31), and the liquid crystal capacitance C is formed by the liquid crystal layer 18 retained between the counter electrode 9 and the pixel electrode 7.

Advantages of using the TFT 10 of the present embodiment as the switching element of the pixel formation part 5 will be described. Since the TFT 10 has a high ON current, it is possible to operate the TFT 10 in a shorter time period. Thus, the resolution and the number of pixel formation parts 5 forming the liquid crystal display panel 2 can be increased, and flickers can be suppressed. Furthermore, due to the reduced leak current, it is possible to retain the orientation state of the liquid crystal molecules (oriented according to the signal voltage of the image signal applied to the liquid crystal capacitance C) until application of the next image signal. Therefore, reduction in contrast of the displayed image is prevented, and the liquid crystal display 1 can display a high quality image.

Advantages of using TFTs 10 of the present embodiment in the gate driver 3a and source driver 3b will be explained. Since the ON current of TFT 10 is high, it is possible to increase the operating speed of the gate driver 3a and source driver 3b composed of the TFTs 10. Accordingly, it is possible to reduce the size of the drive circuit and to reduce the size of the frame of the liquid crystal panel 2 as well as to reduce electrical power consumption of the liquid crystal display 1.

In the above-described liquid crystal display 1, the n-channel type TFTs 10 according to the first embodiment of the present invention were used to construct the pixel formation part 5, the gate driver 3a, and the source driver 3b. Alternatively, the p-channel type TFTs 13 of the second embodiment may be used.

4. Other Modified Examples

The channel layer 60 of the TFT 10 of the aforementioned embodiments was described as being formed of microcrystalline silicon. However, the channel layer may be formed of polysilicon instead. Thus, in the present specification, microcrystalline silicon and polysilicon may collectively be referred to as crystalline silicon.

A case was described in which the TFT 10 of the aforementioned embodiment was used for an active matrix type liquid crystal display 1. However, the present invention can be applied to an active matrix type organic EL (Electro-Luminescence) display device.

INDUSTRIAL APPLICABILITY

The present invention can be applied to a display device such as an active matrix type liquid crystal display or the like. In particular, the present invention is suitable for display devices in which the switching elements of the pixel formation parts and drive circuits, such as the gate driver, source driver, or the like, are constructed of thin film transistors.

DESCRIPTION OF REFERENCE CHARACTERS 1 liquid crystal display
3a source driver
3b gate driver
5 pixel formation part
10 (n-channel type) TFT (thin film transistor)
11 insulating substrate (glass substrate)
13 (p-channel type) TFT (thin film transistor)
20 gate electrode
30 gate insulation film
40a n$^+$ silicon layer (source region)
40b n$^+$ silicon layer (drain region)
43a, 43b protrusion part
45a p$^+$ silicon layer (source region)
45b p$^+$ silicon layer (source region)
50a source electrode
50b drain electrode
60 channel layer

The invention claimed is:

1. A thin film transistor that is a back gate type thin film transistor formed on an insulating substrate, comprising:
a gate electrode formed on said insulating substrate;
a gate insulation film formed so as to cover said gate electrode;
a source region and a drain region, made of a semiconductor including an impurity, disposed with a prescribed interval therebetween on said gate insulation film;
a source electrode and a drain electrode made of a metal, formed on said source region and said drain region, respectively; and
a channel layer formed on a gate insulation film sandwiched between said source electrode and said drain electrode and electrically connected to said source region and said drain region,
wherein said channel layer is made of an intrinsic semiconductor having crystallinity,
wherein one end of said channel layer on a side of said gate electrode is connected electrically to said source region and the other end on the side of said gate electrode is electrically connected to said drain region,
wherein one end of said channel layer on a back channel side is connected electrically to said source electrode and the other end is electrically connected to said drain electrode,
wherein a barrier for restricting movement of carriers is formed at a boundary between said source electrode and said channel layer or at a boundary between said drain electrode and said channel layer on the back channel side of the channel layer,
wherein said source region and said drain region include respective protrusion parts protruding from respective ends of said source electrode and said drain electrode on the gate insulation film sandwiched between said source electrode and said drain electrode, and
wherein said channel layer is further electrically connected to respective upper surfaces of said protrusion parts.

2. The thin film transistor according to claim 1,
wherein ohmic contacts are formed between said source electrode and said source region and between said drain electrode and said drain region, and
wherein the barrier restricting movement of said carriers has an energy level difference greater than that of said ohmic contacts.

3. The thin film transistor according to claim 1,
wherein a concentration of said impurity included in said source region and said drain region is such that a tunneling effect occurs between said source electrode and said source region and between said drain electrode and said drain region, and
wherein the barrier restricting movement of said carriers is respective Schottky barriers formed at the boundary between said source electrode and said channel layer and at the boundary between said drain electrode and said channel layer, respectively.

4. The thin film transistor according to claim 1,
wherein said thin film transistor is an n-channel type transistor, and
wherein the barrier restricting movement of said carriers is formed at the boundary between said source electrode and said channel layer.

5. The thin film transistor according to claim 1,
wherein said thin film transistor is a p-channel type transistor, and
wherein the barrier restricting movement of said carriers is formed at the boundary between said drain electrode and said channel layer.

6. A display device that is an active matrix type display device for displaying an image, comprising:

a display part comprising a plurality of gate lines, a plurality of source lines intersecting said plurality of gate lines, and pixel formation parts arrayed in a matrix corresponding to respective intersection points of said plurality of gate lines and said plurality of source lines;

a gate driver that selectively activates said plurality of gate lines; and a source driver that applies to said source lines an image signal representing an image to be displayed, wherein said pixel formation part includes a switching element for ON-OFF switching according to a signal applied to a corresponding gate line, and wherein said switching element is the thin film transistor according to claim 1.

7. The display device according to claim 6, wherein said gate driver and said source driver are comprised by thin film transistors according to claim 1.

* * * * *